United States Patent
Li et al.

(10) Patent No.: US 12,019,507 B2
(45) Date of Patent: Jun. 25, 2024

(54) GUARDBANDS IN SUBSTRATE PROCESSING SYSTEMS

(71) Applicant: Applied Materials, Inc., Santa Clara, CA (US)

(72) Inventors: Fei Li, Cincinnati, OH (US); Jimmy Iskandar, Santa Clara, CA (US); James Robert Moyne, Canton, MI (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/748,780

(22) Filed: May 19, 2022

(65) Prior Publication Data

US 2023/0376373 A1 Nov. 23, 2023

(51) Int. Cl.
  *G06F 11/00* (2006.01)
  *G06F 11/07* (2006.01)
  *G06F 11/34* (2006.01)

(52) U.S. Cl.
  CPC ...... *G06F 11/0793* (2013.01); *G06F 11/0721* (2013.01); *G06F 11/3495* (2013.01)

(58) Field of Classification Search
  CPC .......................... G06F 11/0793; G06F 11/3495
  USPC ....................................................... 714/1–57
  See application file for complete search history.

(56) References Cited

U.S. PATENT DOCUMENTS

| | | | |
|---|---|---|---|
| 5,560,533 A | 10/1996 | Maenishi | |
| 11,054,815 B2 | 7/2021 | Schulze et al. | |
| 2002/0181133 A1* | 12/2002 | Koshkina | G11B 20/1816 |
| 2003/0033120 A1 | 2/2003 | Chiou | |
| 2004/0148549 A1* | 7/2004 | Voorakaranam | G01R 31/2831 714/25 |
| 2005/0283676 A1* | 12/2005 | Begg | G06F 11/3466 714/38.14 |
| 2009/0125140 A1 | 5/2009 | Dudman et al. | |
| 2009/0276075 A1 | 11/2009 | Good et al. | |
| 2010/0100774 A1* | 4/2010 | Ding | G06F 11/3636 714/E11.029 |

(Continued)

FOREIGN PATENT DOCUMENTS

| JP | 2011524635 A | 9/2011 |
|---|---|---|
| JP | 2004363405 A | 12/2023 |

(Continued)

OTHER PUBLICATIONS

Li et al., "Combining Feature Extraction-Based and full Trace Analysis Capabilities in Fault Detection: Methods and Comparative Analysis." Downloaded on May 19, 2022, IEEE ASMC 2021. 6 Pages.

(Continued)

*Primary Examiner* — Sarai E Butler
(74) *Attorney, Agent, or Firm* — Lowenstein Sandler LLP

(57) ABSTRACT

A method includes identifying trace data including a plurality of data points, the trace data being associated with production, via a substrate processing system, of substrates having property values that meet threshold values. The method further includes generating, based on the trace data and a plurality of allowable types of variance, a guardband including an upper limit and a lower limit for fault detection. The method further includes causing, based on the guardband, performance of a corrective action associated with the substrate processing system.

20 Claims, 17 Drawing Sheets

(56) References Cited

U.S. PATENT DOCUMENTS

| | | | | |
|---|---|---|---|---|
| 2011/0264965 | A1* | 10/2011 | Strohwig | G06Q 20/12 |
| | | | | 714/48 |
| 2011/0296244 | A1* | 12/2011 | Fu | G06F 11/3608 |
| | | | | 714/E11.029 |
| 2016/0154395 | A1 | 6/2016 | Llanos et al. | |
| 2018/0033132 | A1 | 2/2018 | Zafar et al. | |
| 2019/0332519 | A1* | 10/2019 | Myers | G06F 11/3093 |
| 2022/0027230 | A1* | 1/2022 | Burch | G06F 11/348 |

FOREIGN PATENT DOCUMENTS

| | | |
|---|---|---|
| KR | 1020090095694 A | 9/2009 |
| KR | 101735158 B1 | 5/2017 |

OTHER PUBLICATIONS

PCT International Search Report and Written Opinion for International Application No. PCT/US2023/022782 dated Sep. 5, 2023.
PCT International Search Report and Written Opinion for International Application No. PCT/US2023/022783 dated Sep. 5, 2023.
PCT International Search Report and Written Opinion for International Application No. PCT/US2023/022785 dated Sep. 6, 2023.

* cited by examiner

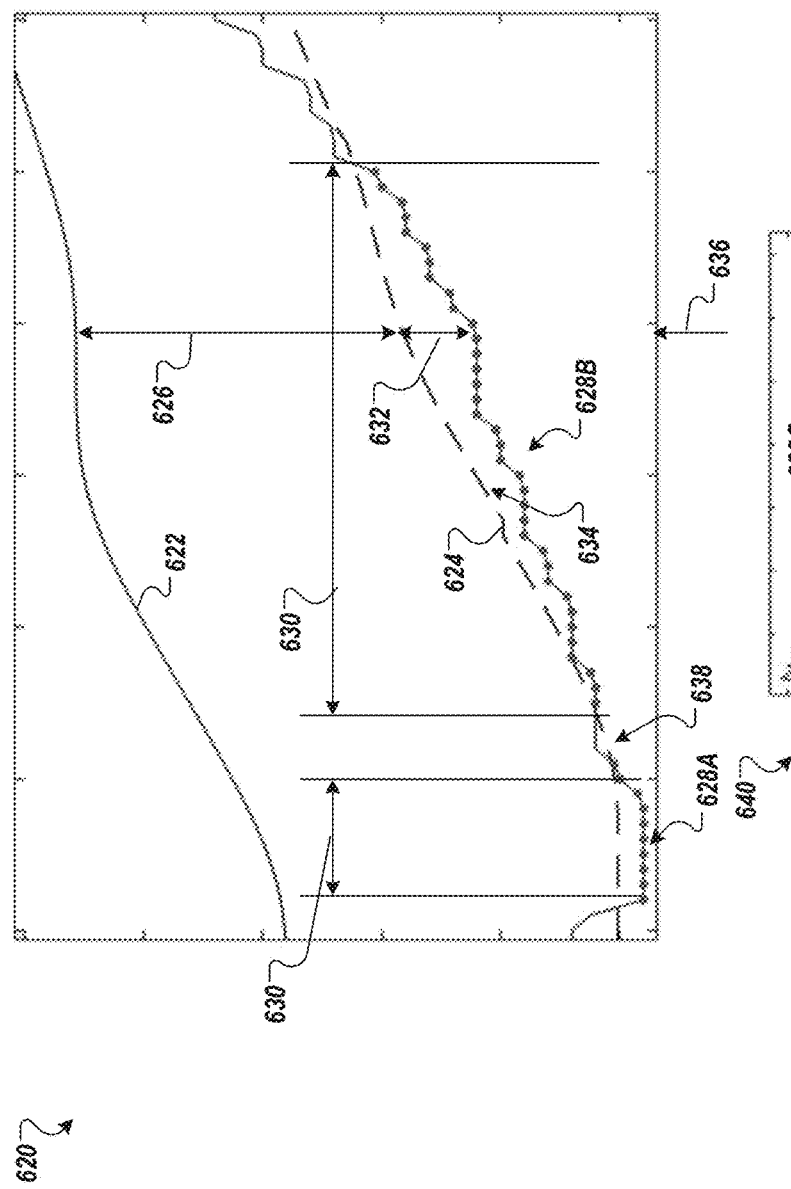
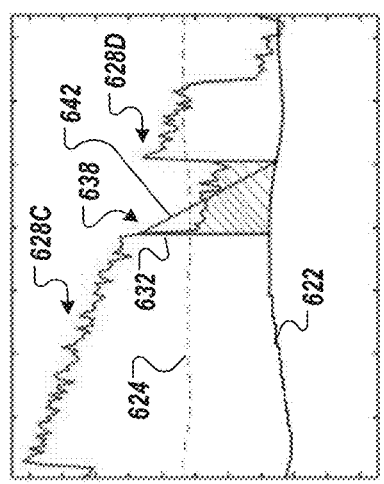
FIG. 6B
FIG. 6C

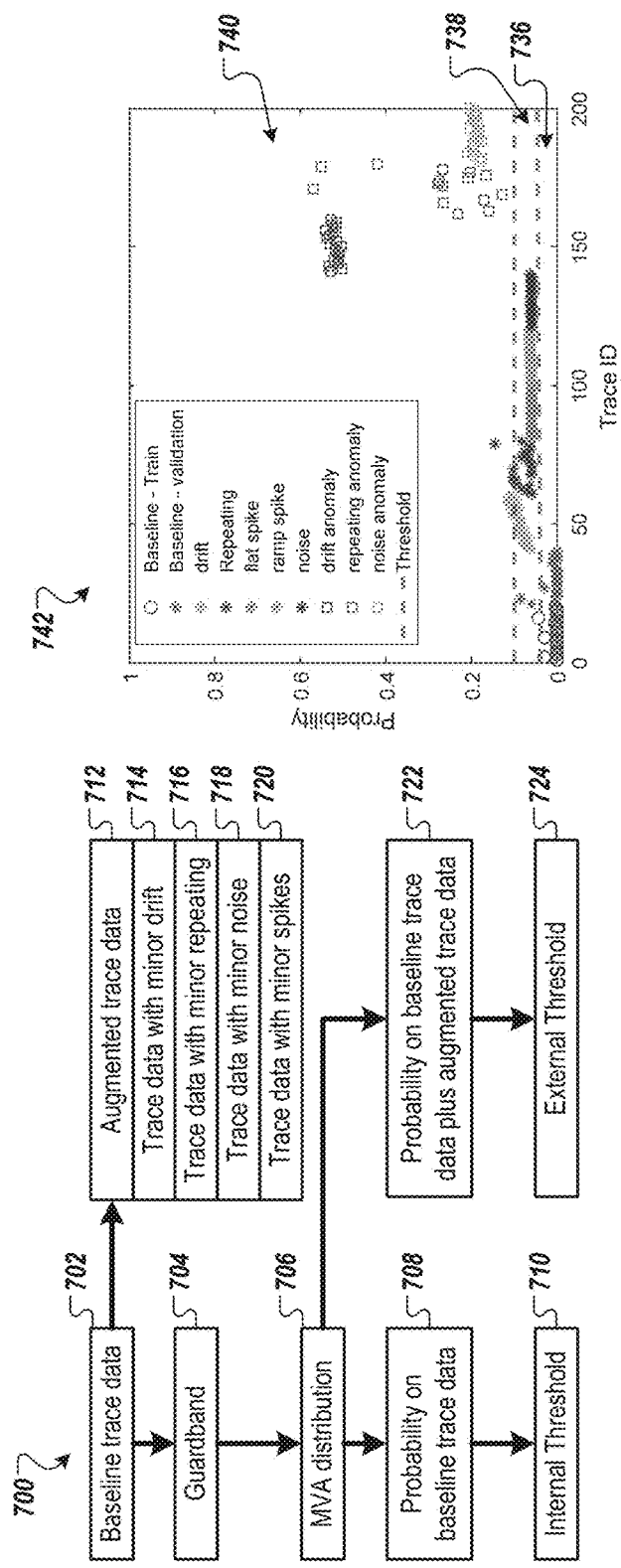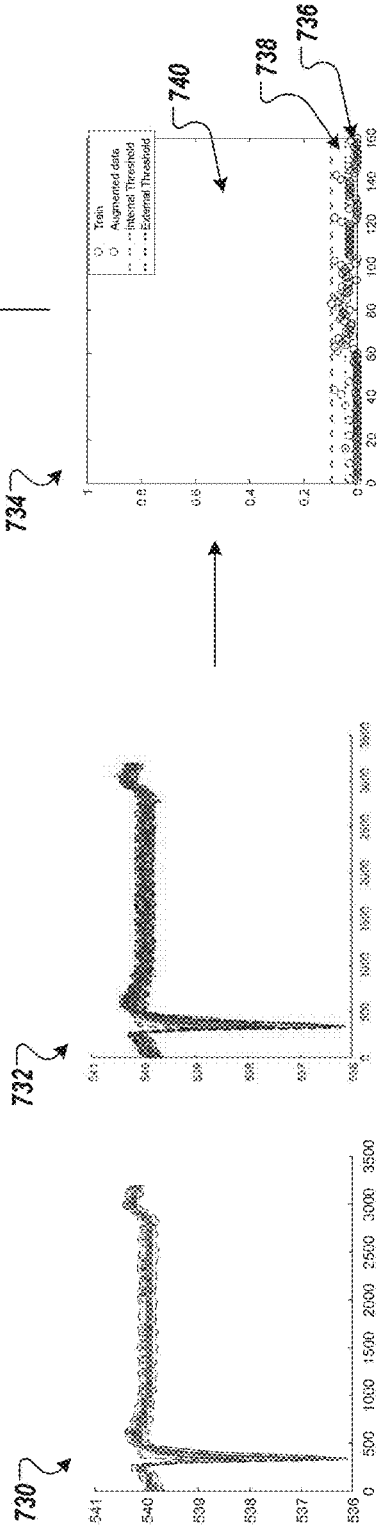
FIG. 7A
FIG. 7B

GUARDBANDS IN SUBSTRATE PROCESSING SYSTEMS

RELATED APPLICATIONS

This application is related to U.S. application Ser. No. 17/748,774, filed May 19, 2022, and U.S. application Ser. No. 17/748,783, filed May 19, 2022, the contents of which are hereby incorporated by reference in their entirety.

TECHNICAL FIELD

The present disclosure relates to guardbands, and in particular to guardbands in substrate processing systems.

BACKGROUND

Products may be produced by performing one or more manufacturing processes using manufacturing equipment. For example, substrate processing equipment may be used to produce substrates via substrate processing operations. Products are to be produced with particular properties. Sensor data is monitored in association with substrate manufacturing processes.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular embodiments of the disclosure or any scope of the claims. Its sole purpose is to present some concepts of the disclosure in a simplified form as a prelude to the more detailed description that is presented later.

In one aspect of the disclosure, a method includes identifying trace data including a plurality of data points, the trace data being associated with production, via a substrate processing system, of substrates having property values that meet threshold values. The method further includes generating, based on the trace data and a plurality of allowable types of variance, a guardband including an upper limit and a lower limit for fault detection. The method further includes causing, based on the guardband, performance of a corrective action associated with the substrate processing system.

In one aspect of the disclosure, a method includes identifying trace data including a plurality of data points, the trace data being associated with production, via a substrate processing system, of substrates. The method further includes comparing the trace data to a guardband generated based on historical trace data and a plurality of allowable types of variance associated with the historical trace data, the historical trace data being associated with historical production, via the substrate processing system, of historical substrates having historical property values that meet threshold values, the guardband including an upper limit and a lower limit for fault detection. The method further includes responsive to one or more data points of the trace data not being within the guardband, causing performance of a corrective action associated with the substrate processing system.

In one aspect of the disclosure, a non-transitory computer-readable storage medium storing instructions which, when executed, cause a processing device to perform operations including identifying trace data including a plurality of data points, the trace data being associated with production, via a substrate processing system, of substrates having property values that meet threshold values. The operations further include generating, based on the trace data and a plurality of allowable types of variance, a guardband including an upper limit and a lower limit for fault detection. The operations further include causing, based on the guardband, performance of a corrective action associated with the substrate processing system.

BRIEF DESCRIPTION OF THE DRAWINGS

The present disclosure is illustrated by way of example, and not by way of limitation in the figures of the accompanying drawings.

FIGS. 6A-E illustrate guardband violation profiling, according to certain embodiments.

FIGS. 7A-F illustrate dynamic acceptable areas outside of guardband limits, according to certain embodiments.

DETAILED DESCRIPTION

Figure 1:
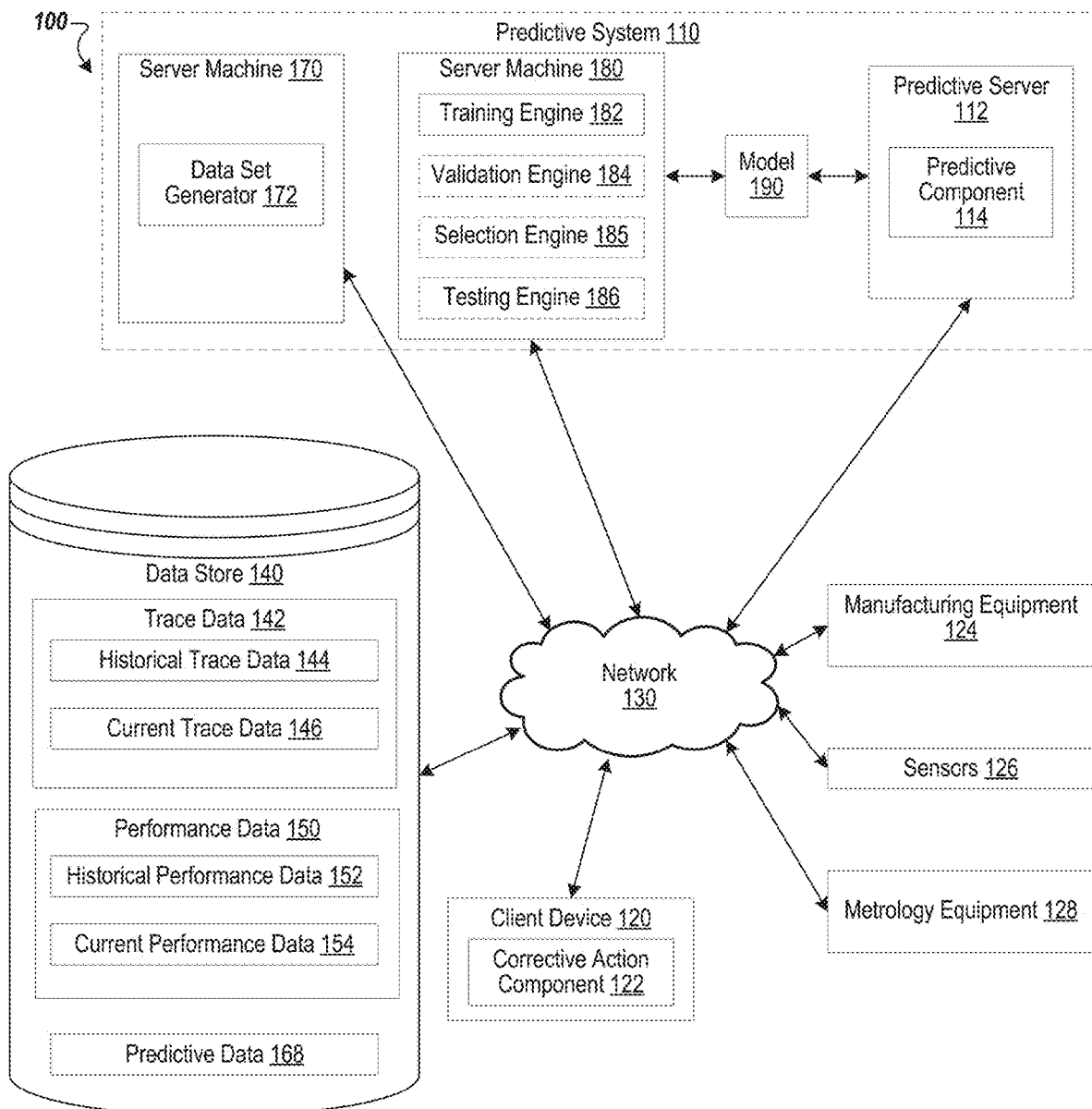
FIG. 1 is a block diagram illustrating an exemplary system architecture, according to certain embodiments.

Described herein are technologies related to guardbands in substrate processing systems (e.g., guardband strengthening, guardband violation profiling, and dynamic areas outside of guardbands). Guardbands may be upper and lower threshold values (e.g., allowable margin of error) around target values. Sensor data may be compared to the guardbands to determine whether the sensor data is within threshold values (e.g., good substrates) or outside of threshold values (e.g., bad substrates).

Products are produced by performing one or more manufacturing processes using manufacturing equipment. Products are to be produced with particular properties. For example, substrate processing equipment is used to produce substrates via substrate processing operations. Substrates that meet particular property values (e.g., dimensions verified by metrology data) are to be used and substrates that do not meet particular property values are to be discarded. Sensor data associated with substrate processing operations is collected over time. Sensor data is monitored for a number of objectives including to attempt to produce substrates that meet particular property values, to attempt to verify that equipment is functioning properly, to attempt to determine when equipment is in need of current or future repair or replacement, and to attempt to determine adjustments to equipment parameters to make processes more effective (e.g., in terms or metrics such as yield or quality, throughput or quantity, cost or longevity). For purposes of simplification of explanation this discussion will focus on the objective of attempting to produce substrates that meet particular property values.

Conventionally, sensor data is summarized across a particular recipe or recipe operation associated with the production of a substrate by equipment. This summarization is defined using a set of statistics such as mean and variance. These summary statistics are then compared to set limits such as mean being between a lower an upper value. If sensor data is within the limits, it is estimated that the substrate will meet particular property values and if sensor data is outside of the limits, it is estimated that the substrate will not meet particular property values. Limits that are too narrow cause false positives (e.g., incorrectly predicting that a substrate will not meet property values). Limits that are too broad cause missed positives (e.g., incorrectly predicting that a substrate meets property values). Variations in sensor data and variations in substrate processing equipment can cause many false positives. Broadening limits to allow for variations in sensor data and substrate processing equipment can cause many missed positives. Conventional systems incorrectly labeling substrates as meeting or not meeting property values causes waste of material, decreased yield, defective products, increased user time, increased downtime of equipment, etc. Attempting to fix the erroneous labeling uses extra processing overhead, bandwidth, energy consumption, metrology operations, user time, etc.

The methods, devices, and systems of the present disclosure provide guardband improvements in substrate processing systems that resolve these and other deficiencies of conventional solutions.

In some embodiments, a processing device identifies trace data associated with production of substrates that have property values that meet threshold values (e.g., good substrates). Trace data may include sets of sensor data associated with production of different substrates and from different types of sensors. In some embodiments, the data is analyzed at the trace level (e.g., as opposed to just providing summary statistics of a sensor across a recipe or recipe operation) by using guardbands. Guardbands may provide upper and lower thresholds across the length of the trace data. This provides many advantages compared to summary statistics (e.g., the present disclosure may identify and profile particular violations in the trace data). The processing device generates an initial guardband based on the trace data (e.g., 3 sigma around the average of the trace data at each window of time in the data where 3 sigma is determined by analyzing multiple runs of data at that particular window of time). The processing device determines, based on the trace data, allowable types of variance of the guardband. Since the trace data is for good wafers, the allowable types of variance of the guardband may be time-shifts (e.g., moving in the x-direction) of one or more of the sets of sensor data to meet the average of the sensor data. The allowable types of variance may include a guardband upper limit that is a different distance from the average of the trace data than the guardband lower limit. The allowable types of variance may include wider guardband limits and narrower guardband limits at particular portions of the guardband. The processing device generates a guardband based on the trace data and the allowable types of variance. The processing device compares additional trace data (e.g., of substrates that may be good or bad) to the guardband and responsive to one or more data points not being within the guardband, the processing device causes performance of a corrective action (e.g., discard the substrates, interrupt substrate processing operations, cause inspection of the substrates, etc.).

In some embodiments, trace data for substrates that are both good and bad is used. The guardband is determined or updated based on an improved understanding of the difference between good and bad trace data, where bad trace data could be a single category or multiple categories representing different modes of or degrees of bad substrates.

In some embodiments, a processing device identifies trace data associated with production of substrates that have property values that meet threshold values (e.g., good substrates). The processing device determines, based on a guardband, guardband violation data points of the trace data. The processing device determines, based on the guardband violation data points, guardband violation shape characterization. The processing device compares additional trace data (e.g., of substrates that may be good or bad) to the guardband to determine guardband violation data points. The processing device determines, based on the guardband violation shape characterization, classification of the guardband violation data points (e.g., whether the guardband violation data points correspond to a good wafer or a bad wafer).

In some embodiments, a processing device identifies trace data associated with production of substrates that have property values that meet threshold values (e.g., good substrates). The processing device determines, based on the trace data, a dynamic acceptable area outside of the guardband limits. The dynamic acceptable area is an area outside of the guardband that corresponds to data points of good substrates that are a result of acceptable noise, acceptable drift, etc. The processing device compares additional trace data (e.g., of substrates that may be good or bad) to the acceptable area outside of the guardband limits. Responsive to one or more of the data points being outside of the acceptable area, the processing device causes a corrective action (e.g., discarding of the substrate, etc.). Responsive to one or more of the data points being within the acceptable area, the processing device causes acceptable area to be updated. For example, the updated acceptable area can allow for additional drift or noise based on the average of additional trace data that was processed.

In some embodiments, the processing device (e.g., performing a guardband method) presents results of trace data runs that are concluded as within acceptable guardband limits, trace data runs that have violations including shape characteristics of these violations, and/or regions where the processing device (e.g., performing a guardband method) cannot make a clear determination that a violation has occurred. The processing device (e.g., performing a guardband method) may allow a user (e.g., subject-matter-expert) to verify or override the guardband method conclusions and propositions. The processing device (e.g., performing the guardband method) may use the feedback from the user (e.g., subject-matter-expert) to update the guardband limits, other violation assessments, and/or guardband characterizations.

Aspects of the present disclosure provide technical advantages over conventional solutions. The present disclosure has less false positives and less missed positives compared to conventional solutions. This provides for less waste of material, increased yield, less defective products, less user time, less downtime of equipment, etc. The present disclosure has less fixing of erroneous labeling of substrates compared to conventional solutions. This provides for less process processor overhead, bandwidth used, energy consumption, metrology operations, user time, etc.

Some embodiments of the present disclosure are described in relation to substrate processing. In some embodiments, the present disclosure applies to other types of manufacturing processes.

Some embodiments of the present disclosure are described in relation to monitoring sensor data with an objective of producing substrates that meet particular property values. In some embodiments, the present disclosure can monitor sensor data for other objectives, such as verifying that equipment is functioning properly, determining when to perform repair or replacement of equipment or equipment components (e.g., preventative maintenance), determining adjustments to equipment parameters to make processes more effective (e.g., in terms or metrics such as yield or quality, throughput or quantity, cost or longevity), and/or the like.

Some embodiments of the present disclosure are described in relation to causing performance of a corrective action. In some embodiments, causing performance of a corrective action can include identifying a characteristic of trace data as being degrading, different, and/or the like.

FIG. 1 is a block diagram illustrating an exemplary system 100 (exemplary system architecture), according to certain embodiments. System 100 includes a client device 120, manufacturing equipment 124 (e.g., substrate processing equipment), sensors 126, metrology equipment 128, a predictive server 112, and a data store 140. The predictive server 112 may be part of a predictive system 110. The predictive system 110 may further include server machines 170 and 180. Predictive system 110 may be used to predict whether an anomaly has occurred, detect that an anomaly has occurred, etc. (e.g., using guardband technology).

In some embodiments, the manufacturing equipment 124 (e.g., cluster tool) is part of a substrate processing system (e.g., integrated processing system). The manufacturing equipment 124 includes one or more of a controller, an enclosure system (e.g., substrate carrier, front opening unified pod (FOUP), autoteach FOUP, process kit enclosure system, substrate enclosure system, cassette, etc.), a side storage pod (SSP), an aligner device (e.g., aligner chamber), a factory interface (e.g., equipment front end module (EFEM)), a load lock, a transfer chamber, one or more processing chambers, a robot arm (e.g., disposed in the transfer chamber, disposed in the front interface, etc.), and/or the like. The enclosure system, SSP, and load lock mount to the factory interface and a robot arm disposed in the factory interface is to transfer content (e.g., substrates, process kit rings, carriers, validation wafer, etc.) between the enclosure system, SSP, load lock, and factory interface. The aligner device is disposed in the factory interface to align the content. The load lock and the processing chambers mount to the transfer chamber and a robot arm disposed in the transfer chamber is to transfer content (e.g., substrates, process kit rings, carriers, validation wafer, etc.) between the load lock, the processing chambers, and the transfer chamber. In some embodiments, the manufacturing equipment 124 includes components of substrate processing systems. In some embodiments, the manufacturing equipment 124 is used to produce one or more products (e.g., substrates, semiconductors, wafers, etc.). In some embodiments, the manufacturing equipment 124 is used to produce one or more components to be used in substrate processing systems.

Sensors 126 may be coupled to the manufacturing equipment 124. The sensors 126 may provide sensor data associated with manufacturing equipment 124 (e.g., associated with producing, by manufacturing equipment 124, corresponding products, such as substrates). The sensor data may be stored as measurements as a function of time (e.g., trace data 142). Trace data 142 may include historical trace data 144 and current trace data 146. Trace data 142 may be used for equipment health and/or product health (e.g., product quality). The manufacturing equipment 124 may produce products following a recipe or performing runs over a period of time. In some embodiments, the trace data 142 may include values of one or more of temperature (e.g., heater temperature), spacing (SP), pressure, High Frequency Radio Frequency (HFRF), voltage of Electrostatic Chuck (ESC), electrical current, flow, power, voltage, etc. Trace data 142 may be associated with or indicative of manufacturing parameters such as hardware parameters (e.g., settings or components (e.g., size, type, etc.) of the manufacturing equipment 124 or process parameters of the manufacturing equipment 124. Data associated with some hardware parameters may, instead or additionally, be stored as manufacturing parameters. Manufacturing parameters may be indicative of input settings to the manufacturing device (e.g., heater power, gas flow, etc.). The trace data 142 and/or manufacturing parameters may be provided while the manufacturing equipment 124 is performing manufacturing processes (e.g., equipment readings when processing products). The trace data 142 may be different for each product (e.g., each substrate).

Metrology equipment 128 may be used to measure properties of products such as substrates (e.g., processed substrates, partially processed substrates, etc.). Metrology equipment may incorporate analytics to estimate or better determine metrology values. Metrology data may be included in performance data 150, along with other performance metrics such as equipment maintenance, yield, etc. Performance data 150 may include historical performance data 152 and current performance data 154. Metrology data and/or performance data 150 may include virtual metrology data, non-virtual metrology data, a hybrid of virtual and non-virtual metrology data, etc.

In some embodiments, trace data 142, performance data 150, and/or manufacturing parameters may be processed (e.g., by the client device 120 and/or by the predictive server 112). Processing of the trace data 142 may include generating features. In some embodiments, the features are a pattern in the trace data 142 or performance data 150 (e.g., slope, width, height, peak, etc.) or a combination of values from the trace data 142 or performance data 150 (e.g., power derived from voltage and current, etc.). The trace data 142 may include features that may be used by the predictive component 114 and/or client device 120 for performing signal processing and/or for obtaining predictive data 168 for performance of a corrective action. Predictive component 114 may be used to predict whether an anomaly has occurred, detect that an anomaly has occurred, etc. (e.g., using guardband technology).

Each instance (e.g., set) of trace data 142 may correspond to a product (e.g., a substrate), a set of manufacturing equipment 124, a type of substrate produced by manufacturing equipment 124, or the like. Each instance of performance data 150 or manufacturing parameters may likewise correspond to a product, a set of manufacturing equipment, a type of substrate produced by manufacturing equipment, or the like. The data store 140 may further store information associating sets of different data types, e.g. information indicative that a set of trace data, sensor data, a set of metrology data, and/or a set of manufacturing parameters that are associated with the same product, manufacturing equipment, type of substrate, etc.

In some embodiments, predictive system 110 may generate predictive data 168 using supervised machine learning (e.g., supervised data set, performance data 150 includes metrology data, the trace data 142 used to train a model 190 is associated with good substrates and bad substrates, etc.). In some embodiments, the predictive system 110 may generate predictive data 168 using semi-supervised learning (e.g., semi-supervised data set, performance data 150 is a predictive percentage, the trace data 142 used to train a model 190 is only associated with good substrates, etc.). In some embodiments, the predictive system 110 may generate predictive data 168 using unsupervised machine learning (e.g., unsupervised data set, clustering, clustering based on trace data 142, etc.). In some embodiments, predictive system 110 may generate predictive data 168 using a model that is one or more of a machine learning model, a statistical model, etc.

The client device 120, manufacturing equipment 124, sensors 126, metrology equipment 128, predictive server 112, data store 140, server machine 170, and server machine 180 may be coupled to each other via a network 130 for generating predictive data 168 to perform corrective actions.

In some embodiments, network 130 is a public network that provides client device 120 with access to the predictive server 112, data store 140, and other publicly available computing devices. In some embodiments, network 130 is a private network that provides client device 120 access to manufacturing equipment 124, sensors 126, metrology equipment 128, data store 140, and other privately available computing devices. Network 130 may include one or more Wide Area Networks (WANs), Local Area Networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

The client device 120 may include a computing device such as Personal Computers (PCs), laptops, mobile phones, smart phones, tablet computers, netbook computers, network connected televisions ("smart TV"), network-connected media players (e.g., Blu-ray player), a set-top-box, Over-the-Top (OTT) streaming devices, operator boxes, etc. The client device 120 may include a corrective action component 122. Corrective action component 122 may receive user input (e.g., via a Graphical User Interface (GUI) displayed via the client device 120).

In some embodiments, the corrective action component 122 obtains trace data 142 (e.g., current trace data 146) associated with the manufacturing equipment 124 (e.g., from data store 140, etc.) and provides the trace data 142 (e.g., current trace data 146) associated with the manufacturing equipment 124 to the predictive system 110. In some embodiments, the corrective action component 122 stores trace data 142 in the data store 140 and the predictive server 112 retrieves the trace data 142 from the data store 140. In some embodiments, the predictive server 112 may store output (e.g., predictive data 168) of the trained machine learning model(s) 190 in the data store 140 and the client device 120 may retrieve the output from the data store 140. In some embodiments, the corrective action component 122 receives an indication of a corrective action from the predictive system 110 and causes the corrective action to be implemented. Client device 120 may include an operating system that allows users to one or more of generate, view, or edit data (e.g., indication associated with manufacturing equipment 124, corrective actions associated with manufacturing equipment 124, etc.).

In some embodiments, the historical performance data 152 corresponds to historical property data of products (e.g., produced using manufacturing parameters associated with historical trace data 144 and stored manufacturing parameters) and predictive data 168 is associated with predicted property data (e.g., of products to be produced or that have been produced in conditions recorded by current trace data 146 and/or manufacturing parameters). In some embodiments, predictive data 168 is predicted metrology data (e.g., virtual metrology data) of the products to be produced or that have been produced according to conditions recorded as current trace data 146 and/or manufacturing parameters. In some embodiments, predictive data 168 is an indication of abnormalities (e.g., abnormal products, abnormal components, abnormal manufacturing equipment 124, abnormal energy usage, etc.) and one or more causes of the abnormalities. In some embodiments, the predictive data 168 is an indication of change over time or drift in some component of manufacturing equipment 124, sensors 126, metrology equipment 128, or the like. In some embodiments, predictive data 168 is an indication of an end of life of a component of manufacturing equipment 124, sensors 126, metrology equipment 128, or the like.

Performing manufacturing processes that result in defective products can be costly in time, energy, products, components, manufacturing equipment 124, the cost of identifying the defects and discarding the defective product, etc. By generating predictive data 168 based on trace data 142 and causing performance of a corrective action based on the predictive data 168, system 100 can have the technical advantage of avoiding the cost of producing, identifying, and discarding defective products.

Performing manufacturing processes that result in failure of the components of the manufacturing equipment 124 can be costly in downtime, damage to products, damage to equipment, express ordering replacement components, etc. By generating predictive data 168 based on trace data 142 (e.g., manufacturing parameters that are being used or are to be used to manufacture a product) and causing performance of a corrective action (e.g., predicted operational maintenance, such as replacement, processing, cleaning, etc. of components) based on the predictive data 168, system 100 can have the technical advantage of avoiding the cost of one or more of unexpected component failure, unscheduled downtime, productivity loss, unexpected equipment failure, product scrap, or the like. Monitoring the performance over time of components (e.g. manufacturing equipment 124, sensors 126, metrology equipment 128, and the like) may provide indications of degrading components.

Manufacturing parameters may be suboptimal for producing products which may have costly results of increased resource (e.g., energy, coolant, gases, etc.) consumption, increased amount of time to produce the products, increased component failure, increased amounts of defective products, etc. By generating predictive data 168 based on features of trace data 142 and causing, based on the predictive data 168, performance of corrective actions of updating manufacturing parameters (e.g., setting optimal manufacturing parameters), system 100 can have the technical advantage of using optimal manufacturing parameters (e.g., hardware parameters, process parameters, optimal design) to avoid costly results of suboptimal manufacturing parameters.

Corrective action may be associated with one or more of Computational Process Control (CPC), Statistical Process Control (SPC) (e.g., SPC on electronic components to determine process in control, SPC to predict useful lifespan of components, SPC to compare to a graph of 3-sigma, etc.), Advanced Process Control (APC), model-based process control, preventative operative maintenance, design optimization, updating of manufacturing parameters or updating manufacturing recipes for current or future manufacturing processes, feedback control, machine learning modification, or the like.

In some embodiments, the corrective action includes providing an alert (e.g., an alarm to stop or not perform the manufacturing process if the predictive data 168 indicates a predicted abnormality, such as an abnormality of the product, a component, or manufacturing equipment 124). In some embodiments, the corrective action includes scheduling preventative maintenance. In some embodiments, the corrective action includes scheduling corrective maintenance. In some embodiments, the corrective action includes updating a process recipe to produce subsequent substrates. In some embodiments, the corrective action may be determined in view of an ongoing substrate processing process, and may include updating a current process. In some embodiments, the corrective action includes correcting chamber drift associated with the manufacturing equipment 124 (e.g., substrate processing equipment). In some embodiments, the corrective action includes correcting sensor drift of sensors associated with the manufacturing equipment 124 (e.g., substrate processing equipment). In some embodiments, the corrective action includes providing feedback control (e.g., modifying a manufacturing parameter responsive to the predictive data 168 indicating a predicted abnormality). In some embodiments, the corrective action includes providing machine learning (e.g., modifying one or more manufacturing parameters based on the predictive data 168). In some embodiments, performance of the corrective action includes causing updates to one or more manufacturing parameters. In some embodiments, one or more corrective actions are to be performed in association with components of the substrate processing equipment.

Manufacturing parameters may include hardware parameters (e.g., replacing components, using certain components, replacing a processing chip, updating firmware, etc.) and/or process parameters (e.g., temperature, pressure, flow, rate, electrical current, voltage, gas flow, lift speed, etc.). In some embodiments, the corrective action includes causing preventative operative maintenance (e.g., replace, process, clean, etc. components of the manufacturing equipment 124). In some embodiments, the corrective action includes causing design optimization (e.g., updating manufacturing parameters, manufacturing processes, manufacturing equipment 124, etc. for an optimized product). In some embodiments, the corrective action includes a updating a recipe (e.g., manufacturing equipment 124 to be in an idle mode, a sleep mode, a warm-up mode, etc.).

The predictive server 112, server machine 170, and server machine 180 may each include one or more computing devices such as a rackmount server, a router computer, a server computer, a personal computer, a mainframe computer, a laptop computer, a tablet computer, a desktop computer, Graphics Processing Unit (GPU), accelerator Application-Specific Integrated Circuit (ASIC) (e.g., Tensor Processing Unit (TPU)), etc.

The predictive server 112 may include a predictive component 114. In some embodiments, the predictive component 114 may receive current trace data 146 (e.g., receive from the client device 120, retrieve from the data store 140) and generate output (e.g., predictive data 168) for performing corrective action associated with the manufacturing equipment 124 based on the current data. In some embodiments, predictive component 114 may use one or more trained models 190 to determine the output for performing the corrective action based on current data. In some embodiments, the predictive component 114 predicts that an anomaly has occurred or will occur. In some embodiments, the predictive component 114 predicts that another event has occurred or may occur.

Model 190 may be a single model, or many models. The models may be applied sequentially, multiple models may be used simultaneously, the appropriate model may be chosen based on some metric, a combination of these approaches may be used, or the like. Model 190 (or the models included in model 190) may be a machine learning model, including supervised, unsupervised, or semi-supervised machine learning model. Model 190 may not be a machine learning model, for example a statistical model, correlation model, etc.

In some embodiments, a first model 190 is used to generate a guardband (e.g., see FIGS. 2A-D), a second model 190 is used for guardband violation profiling (e.g., see FIGS. 3A-D), and a third model 190 is used for generating dynamic areas outside of a guardband (e.g., see FIGS. 4A-D).

In some embodiments, data input to model 190 may include trace data 142 from a single sensor 126. In other embodiments, data input to model 190 may include trace data 142 from many sensors 126 indicating values of different properties. Data input may include manufacturing parameters. The features extracted from the trace data 142, the method of extraction of the features, the corrective actions and/or predictive data 168 associated with the features, and the method of associating the corrective actions and/or predictive data 168 may all be tuned for the data provided as input.

In some embodiments, the predictive component 114 receives current trace data 146 and provides the current trace data 146 as input to model 190, and obtains output indicative of predictive data 168 from model 190. In some embodiments, predictive data 168 is indicative of performance data 150 (e.g., metrology data, yield, etc.). In some embodiments, predictive data 168 is indicative of a corrective action.

In some embodiments, model 190 takes as input trace data 142 (e.g., and data indicative of recipe, manufacturing equipment components, etc. associated with trace data 142) and produces as output predictive data 168. Model 190 may be a single model or may include many models. Model 190 may determine, based on input data, which processes to perform, or a user may indicate which analysis are appropriate for the input data, or a combination of these.

Data store 140 and/or may be a memory (e.g., random access memory), a drive (e.g., a hard drive, a flash drive), a database system, or another type of component or device capable of storing data. Data store 140 and/or may include multiple storage components (e.g., multiple drives or multiple databases) that may span multiple computing devices (e.g., multiple server computers). The data store 140 may store trace data 142, performance data 150, and predictive data 168. Trace data 142 may include historical trace data 144 and current trace data 146. Trace data may include sensor data time traces over the duration of manufacturing processes, associations of data with physical sensors, pre-processed data, such as averages and composite data, and data indicative of sensor performance over time (e.g., many manufacturing processes). Manufacturing parameters and performance data 150 may contain similar features. Historical trace data 144, manufacturing parameters, and historical performance data 152 may be historical data (e.g., at least a portion for training model 190). Current trace data 146 may be current data (e.g., at least a portion to be input into model 190, subsequent to the historical data) for which predictive data 168 is to be generated (e.g., for performing corrective actions).

In some embodiments, predictive system 110 further includes server machine 170 and server machine 180. Server machine 170 includes a data set generator 172 that is capable of generating data sets (e.g., a set of data inputs and a set of target outputs) to train, validate, and/or test one or more models, such as machine learning models. Model 190 may include one or more machine learning models, or may be other types of models such as statistical models. Models incorporating machine learning may be trained using input data and in some cases target output data. Models that do not incorporate machine learning may also be trained. In some embodiments, data set generator 172 may partition the historical data (e.g., historical trace data 144, manufacturing parameters, or historical performance data 152 stored in data store 140) into a training set (e.g., sixty percent of the historical data), a validating set (e.g., twenty percent of the historical data), and a testing set (e.g., twenty percent of the historical data). In some embodiments, the predictive system 110 (e.g., via predictive component 114) generates multiple sets of elements. For example a first set of elements may correspond to a first set of types of sensor data (e.g., from a first set of sensors, first combination of values from first set of sensors, first patterns in the values from the first set of sensors) that correspond to each of the data sets (e.g., training set, validation set, and testing set) and a second set of elements may correspond to a second set of types of sensor data (e.g., from a second set of sensors different from the first set of sensors, second combination of values different from the first combination, second patterns different from the first patterns) that correspond to each of the data sets.

Server machine 180 includes a training engine 182, a validation engine 184, selection engine 185, and/or a testing engine 186. An engine (e.g., training engine 182, validation engine 184, selection engine 185, and testing engine 186) may refer to hardware (e.g., circuitry, dedicated logic, programmable logic, microcode, processing device, etc.), software (such as instructions run on a processing device, a general purpose computer system, or a dedicated machine), firmware, microcode, or a combination thereof. The training engine 182 may be capable of training machine learning model 190 or various machine learning models included in model 190 using one or more sets of elements associated with the training set from data set generator 172. The training engine 182 may generate multiple trained machine learning models 190, where each trained machine learning model 190 corresponds to a distinct set of elements of the training set (e.g., sensor data from a distinct set of sensors). For example, a first trained machine learning model may have been trained using all elements (e.g., X1-X5), a second trained machine learning model may have been trained using a first subset of elements (e.g., X1, X2, X4), and a third trained machine learning model may have been trained using a second subset of elements (e.g., X1, X3, X4, and X5) that may partially overlap the first subset of elements. Data set generator 172 may receive the output of a trained machine learning model (e.g., a model trained to perform a first operation of trace data processing), collect that data into training, validation, and testing data sets, and use the data sets to train a second machine learning model (e.g., a model to be trained to perform a second operation of trace data processing).

The validation engine 184 may be capable of validating a trained machine learning model 190 using a corresponding set of elements of the validation set from data set generator 172. For example, a first trained machine learning model 190 that was trained using a first set of elements of the training set may be validated using the first set of elements of the validation set. The validation engine 184 may determine an accuracy of each of the trained machine learning models 190 based on the corresponding sets of elements of the validation set. The validation engine 184 may discard trained machine learning models 190 that have an accuracy that does not meet a threshold accuracy. In some embodiments, the selection engine 185 may be capable of selecting one or more trained machine learning models 190 that have an accuracy that meets a threshold accuracy. In some embodiments, the selection engine 185 may be capable of selecting the trained machine learning model 190 that has the highest accuracy of the trained machine learning models 190. In some embodiments, validation engine 184 and selection engine 185 may repeat this process for each machine learning model include in model 190.

In some embodiments, validation engine 184 performs verification and/or validation (e.g., verification and validation (V&V)). Verification and validation may be independent procedures that are used together to determine whether a product, service, or system (e.g., a machine learning model) meets requirements and specifications and intends its intended purpose. Validation may include the assurance that a machine learning model meets the needs of the customer or other identified stakeholder (e.g., involving acceptance and suitability with external customers). Verification may include evaluation of whether or not a machine learning model complies with a regulation, requirement, specification, or imposed condition (e.g., an internal process).

The testing engine 186 may be capable of testing a trained machine learning model included in model 190 using a corresponding set of elements of a testing set from data set generator 172. For example, a first trained machine learning model 190 that was trained using a first set of elements of the training set may be tested using the first set of elements of the testing set. Testing engine 186 may determine a trained machine learning model included in model 190 that has the highest accuracy of all of the trained machine learning models based on the testing sets. Testing engine 186 may repeat this process for every machine learning model included in model 190.

Model 190 may refer to the model artifact that is created by the training engine 182 using a training set that includes data inputs and corresponding target outputs (correct answers for respective training inputs). Patterns in the data sets can be found that map the data input to the target output (the correct answer), and the machine learning model is provided mappings that captures these patterns. The machine learning model may use one or more of Support Vector Machine (SVM), Radial Basis Function (RBF), clustering, supervised machine learning, semi-supervised machine learning, unsupervised machine learning, k-Nearest Neighbor algorithm (k-NN), linear regression, random forest, neural network (e.g., artificial neural network), etc.

Predictive component 114 may provide current trace data 146 to model 190 and may run the trained machine learning model 190 on the input to obtain one or more outputs. The predictive component 114 may be capable of determining (e.g., extracting) predictive data 168 from the output of model 190 and may determine (e.g., extract) confidence data from the output that indicates a level of confidence that the predictive data 168 is an accurate predictor of a process associated with the input data for products produced or to be produced using the manufacturing equipment 124 at the current trace data 146 and/or manufacturing parameters. The predictive component 114 may also be capable of determining a confidence range associated with the prediction event such as a remaining useful life (RUL) window including an upper limit and a lower limit. The predictive component 114 or corrective action component 122 may use the confidence data to decide whether to cause a corrective action and/or when to cause a corrective action associated with the manufacturing equipment 124 based on predictive data 168.

The confidence data may include or indicate a level of confidence that predictive data 168 is an accurate prediction for products associated with at least a portion of the input data. In one example, the level of confidence is a real number between 0 and 1 inclusive, where 0 indicates no confidence that the predictive data 168 is an accurate prediction for products processed according to input data and 1 indicates absolute confidence that the predictive data 168 accurately predicts properties of products processed according to input data. Responsive to the confidence data indicating a level of confidence below a threshold level for a predetermined number of instances (e.g., percentage of instances, frequency of instances, frequency of occurrence, total number of instances, etc.) the predictive component 114 may cause model 190 to be re-trained (e.g., based on current trace data 146, manufacturing parameters, current performance data 154, etc.).

For purpose of illustration, rather than limitation, aspects of the disclosure describe the training of one or more machine learning models 190 using historical data (e.g., historical trace data 144, historical performance data 152) and inputting current data (e.g., current trace data 146) into the one or more trained machine learning models 190 to determine predictive data 168. In other embodiments, a heuristic model or rule-based model is used to determine predictive data 168 (e.g., without using a trained machine learning model). Predictive component 114 may monitor historical trace data 144 and historical performance data 152.

In some embodiments, the functions of client device 120, predictive server 112, server machine 170, and server machine 180 may be provided by a fewer number of machines. For example, in some embodiments server machines 170 and 180 may be integrated into a single machine, while in some other embodiments, server machine 170, server machine 180, and predictive server 112 may be integrated into a single machine. In some embodiments, client device 120 and predictive server 112 may be integrated into a single machine.

In general, functions described in one embodiment as being performed by client device 120, predictive server 112, server machine 170, and server machine 180 can also be performed on predictive server 112 in other embodiments, if appropriate. In addition, the functionality attributed to a particular component can be performed by different or multiple components operating together. For example, in some embodiments, the predictive server 112 may determine the corrective action based on the predictive data 168. In another example, client device 120 may determine the predictive data 168 based on output from a trained machine learning model.

In addition, the functions of a particular component can be performed by different or multiple components operating together. One or more of the predictive server 112, server machine 170, or server machine 180 may be accessed as a service provided to other systems or devices through appropriate application programming interfaces (API).

In embodiments, a "user" may be represented as a single individual. However, other embodiments of the disclosure encompass a "user" being an entity controlled by a plurality of users and/or an automated source. For example, a set of individual users federated as a group of administrators may be considered a "user."

Embodiments of the disclosure may be applied to data quality evaluation, feature enhancement, model evaluation, Virtual Metrology (VM), Predictive Maintenance (PdM), limit optimization, anomaly or fault detection, anomaly or fault classification, or the like.

FIGS. 2A-D, 3A-D, and 4A-D are flow diagrams of methods 200A-D, 300A-D, and 400A-D associated with guardbands, according to certain embodiments. In some embodiments, methods 200A-D, 300A-D, and 400A-D are performed by processing logic that includes hardware (e.g., circuitry, dedicated logic, programmable logic, microcode, processing device, etc.), software (such as instructions run on a processing device, a general purpose computer system, or a dedicated machine), firmware, microcode, or a combination thereof. In some embodiments, methods 200A-D, 300A-D, and 400A-D are performed, at least in part, by predictive system 110. In some embodiments, methods 200A-D, 300A-D, and 400A-D are performed, at least in part, by one or more of predictive system 110 (e.g., predictive server 112, predictive component 114), client device 120 (e.g., corrective action component), manufacturing equipment 124, and/or metrology equipment 128. In some embodiments, a non-transitory storage medium stores instructions that when executed by a processing device (e.g., of predictive system 110, of server machine 180, of predictive server 112, etc.), cause the processing device to perform one or more of methods 200A-D, 300A-D, and 400A-D.

For simplicity of explanation, methods 200A-D, 300A-D, and 400A-D are depicted and described as a series of operations. However, operations in accordance with this disclosure can occur in various orders and/or concurrently and with other operations not presented and described herein. Furthermore, in some embodiments, not all illustrated operations are performed to implement methods 200A-D, 300A-D, and 400A-D in accordance with the disclosed subject matter. In addition, those skilled in the art will understand and appreciate that methods 200A-D, 300A-D, and 400A-D could alternatively be represented as a series of interrelated states via a state diagram or events.

In some embodiments, FIGS. 2A-D and FIGS. 3A-D are directed to sequential data guardband analysis for improved fault diagnostics, fault classification, and prediction (e.g., sequential guardband analysis for fault detection and classification (FDC)). In some embodiments, the present disclosure provides improves analysis of a sequential data stream (e.g., trace data) using guardband fault diagnostics full trace analysis (FTA) to provide improved detection, classification, and prediction including reduced false alarms (e.g., false positives) and missed alarms (e.g., missed positives). Conventional sensor trace analyses may have false and missed positives (e.g., inability to capture normal variation sufficiently, inability to adapt models over time, inability to address recipe end-pointing, inability to address out-of-phase traces, inability to transfer models to different domains, etc.) which results in conventional low adoption rate of guardbands. Conventional summary statistics may miss parts of trace data (e.g., transient regions). The present disclosure addresses false and missed positives and is adaptive to provide robustness over time and flexibility to address different domains (e.g., see FIGS. 8A-B). The present disclosure may use guardbands to analyze both transient and steady-state regions and to extract complex features (e.g., more complex than unique variable analysis (UVA)).

A guardband of the present disclosure may be used to detect anomalies or faults that occur in trace data but may not conform to a typical anomaly shape such as a spike or oscillation. Conventional guardbands may have output quality issues based on false positives (e.g., in transients), blowup in bounds around transitions, trace-to-trace variability treated as anomalous, all violations treated equal and not profiled or quantified. Guardbands of the present disclosure may solve these shortcomings. Guardbands of the present disclosure may be provided in isolation or may be combined with other analysis capabilities such as semi-automated feature extraction (SFE).

A guardband may be a channel defined for a data stream that is meant to identify a region of commonality (e.g., acceptable values) as a function of the position in the data stream. The data stream is often the value of a sensor over the course of some event such as a production run. The data stream is often trace data which is a sequence of data values presented and positioned as a function of time (e.g., x-axis is time). The sequencing may not be time based (e.g., may be an indication of count of something such as number of products produced or number of errors logged). The term "acceptable" is a function of the application environment and objective of the guardband analysis. For example, "acceptable" could be "not-anomalous" or "not-faulty." The guardband channel may have an upper and lower limit. In some embodiments, these limits may be calculated using statistical methods along the duration of the data stream. For example, the channel could represent +/−3-sigma of the value of multiple traces of a particular sensor, where variance is calculated at each time value of the data stream. Smoothing techniques (e.g., time window averaging) may be employed to allow the channel to be more noise resistant and smooth.

FTA guardbanding may be used for anomaly trace with minor oscillation at transient segments. FTA guardbanding may be used to analyze multiple traces or trace partition from a particular sensor over multiple runs. FTA guardbanding may establish upper and lower limits that indicate a normal range or channel for the sensor data over time (e.g., 3-sigma). The solution identifies and profiles excursions from the guardband. FTA capability can be used along with SFE in a complementary fashion to provide for comprehensive analysis and as input to a fingerprint library. A guardband can be associated with a single sensor (UVA) or across multiple sensors (multivariate analysis (MVA)). For MVA, the sensor value (e.g., y-axis) may be a metric that represents some combination of the sensors involved in the MVA.

In some embodiments, a guardband may include multiple guardbands (e.g., a warning guardband fully contained within an error guardband). In some embodiments, a first area is a normal region regardless of other parameters, a second area is a region where classification of good or bad is based on analysis of other parameters, and a third area is a faulty region regardless of other parameters.

In some embodiments, the x-axis parameter of the guardband or the parameter that defines sequencing aspect of the data is time (e.g., granularly associated with the sensor(s) read rate). In some embodiments, a substrate number in a process tool may correspond to substrate processes.

In some embodiments, the guardband violation definition may be an anomaly, fault, warning, event trigger, and/or prediction. Guardband violation determination and interpretation may relate to the purpose of the guardband (e.g., fault or anomaly detection). A single data point outside of the guardband channel may indicate a fault. A probability distribution function may be used to define the area, duration, and magnitudes of portions that includes violation areas in the trace. These violation areas may be evaluated (e.g., violation area attribute values) to interpret if there is a fault.

Figure 2A:
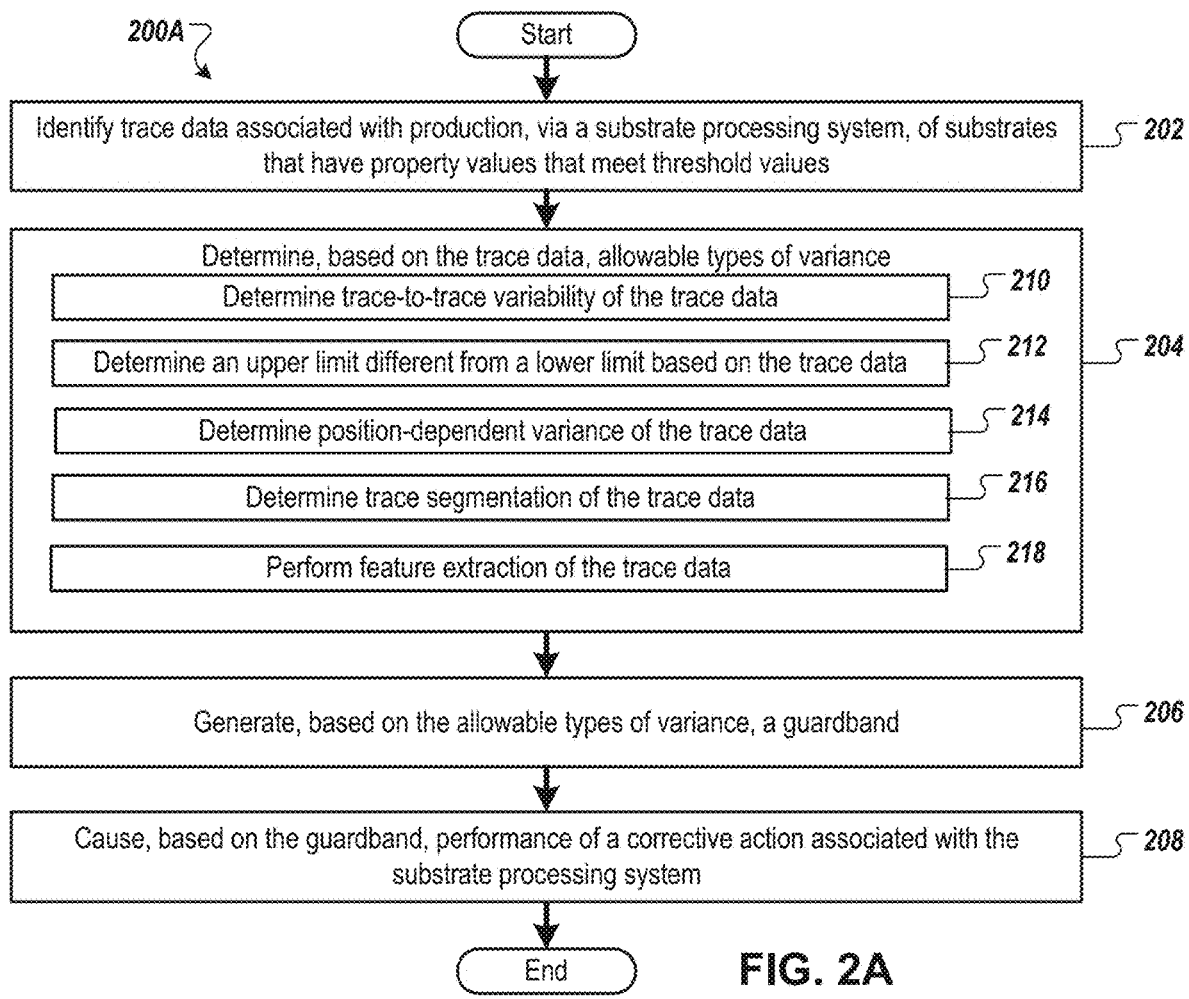
FIGS. 2A-D are flow diagrams of methods associated with generating a guardband, according to certain embodiments.
Figure 2B:
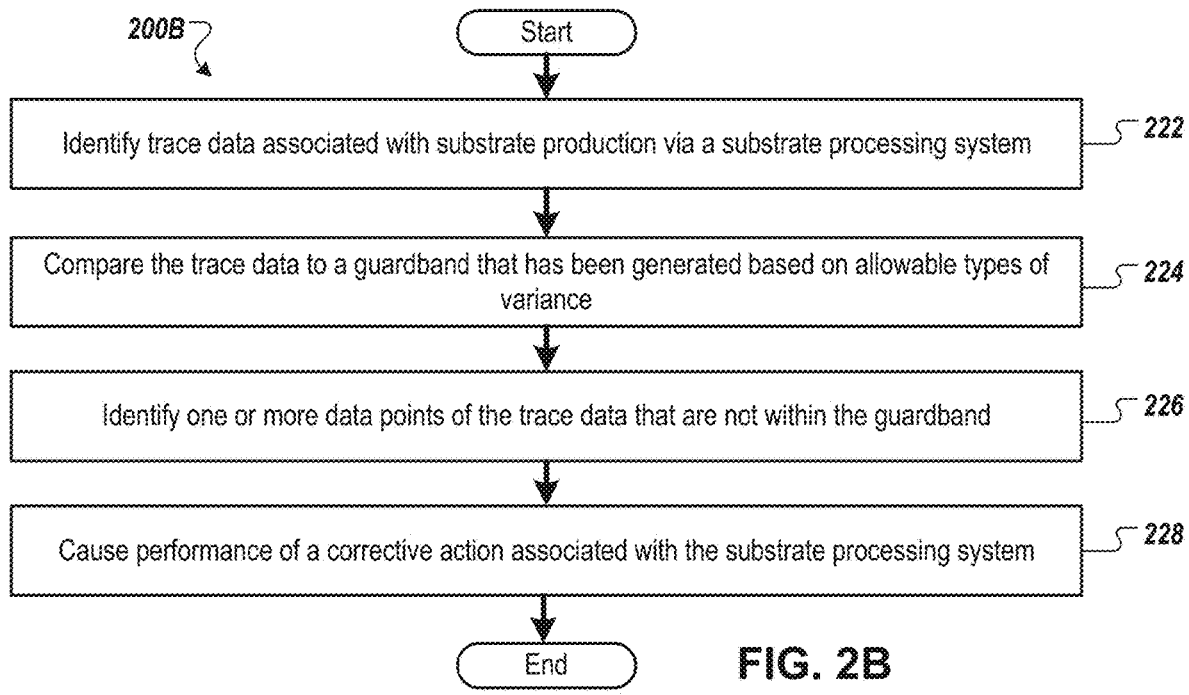
Figure 2C:
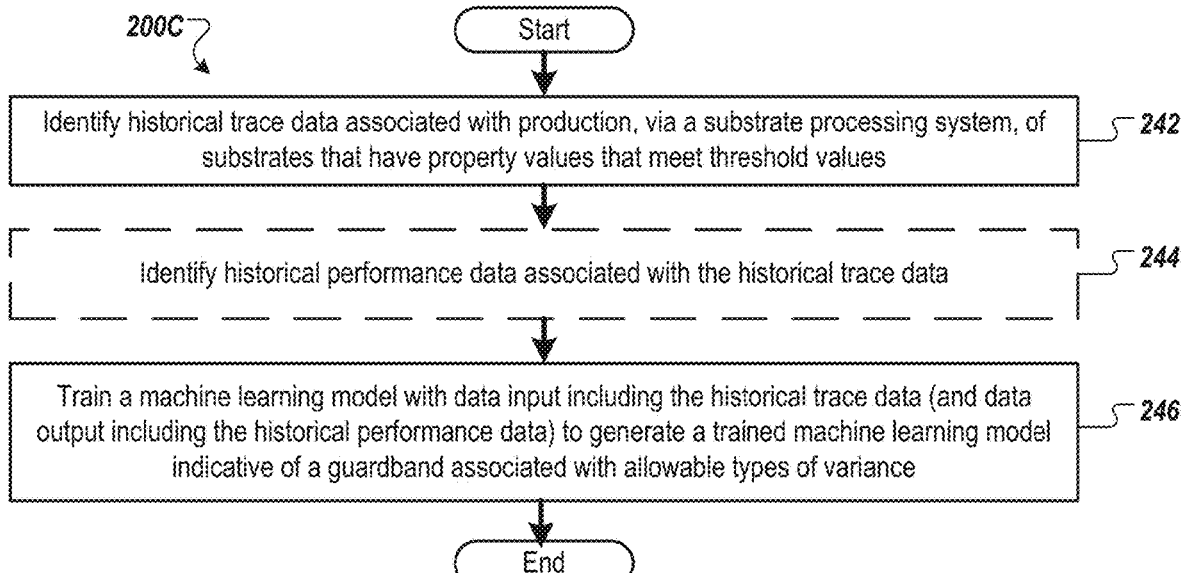
Figure 2D:
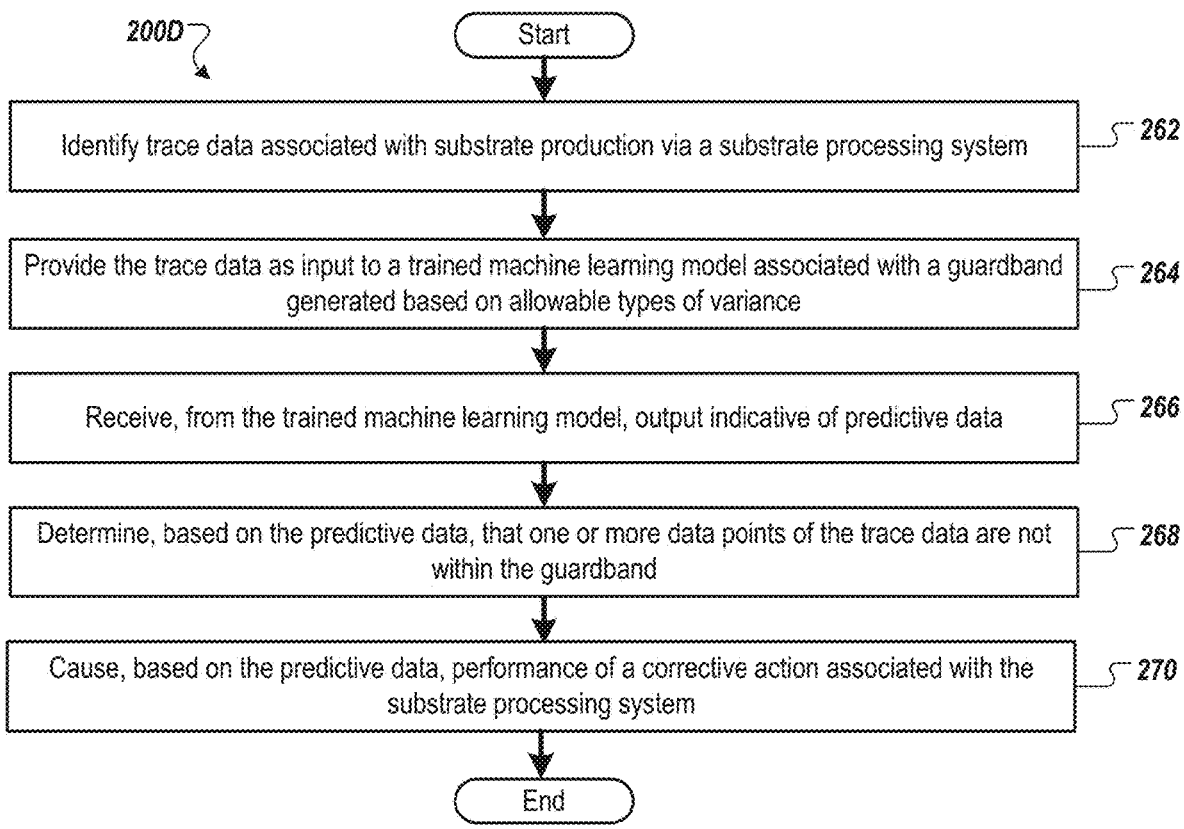

FIGS. 2A-D are flow diagrams of methods 200A-D associated with generating a guardband, according to certain embodiments. FIG. 2A is a flow diagram of a method 200A associated with generating a guardband, FIG. 2B is a flow diagram of a method 200B associated with using a guardband, FIG. 2C is a flow diagram of a method 200C associated with generating a guardband via machine learning, and FIG. 2D is a flow diagram of a method 200D associated with using a guardband via machine learning.

Referring to FIG. 2A, in some embodiments, at block 202, the processing logic identifies trace data associated with production, via a substrate processing system, of substrates (e.g., good substrates) that have property values that meet threshold values. Trace data includes a separate set of sensor data over time for each of the substrates. In some embodiments, trace data includes sensor data (e.g., different types of sensor data) from multiple different sensors for each of the substrates.

At block 204, the processing logic determines, based on the trace data, allowable types of variance (e.g., of a guardband).

In some embodiments, processing logic generates a guardband based on the trace data. The guardband may include an upper limit and a lower limit for fault detection (e.g., anomaly detection). In some embodiments, to form a guardband, an average of all of the trace data is generated and then offsets from the average (e.g., three sigma) is used as the upper limit and the lower limit. Conventionally, the upper limit and the lower limit are equally distanced from the average of the trace data.

Since the trace data is for good substrates, any variations from the guardband formed by the trace data are allowable types of variance.

Figure 5A:
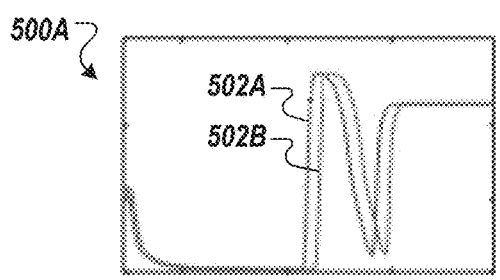
FIGS. 5A-E illustrate graphs of allowable types of variance, according to certain embodiments.
Figure 5B:
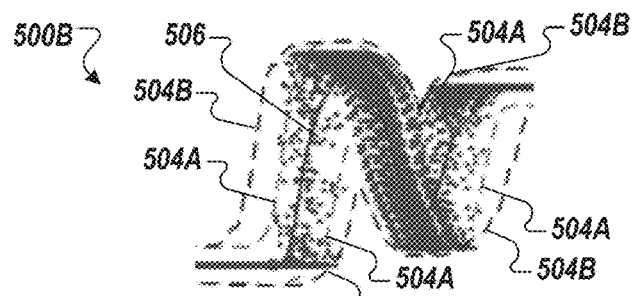

In some embodiments, block 204 includes processing logic determining trace-to-trace variability of the trace data at block 210 (see FIGS. 5A-B). In some embodiments, the allowable types of variance include trace-to-trace variability of time shifts. The trace data may include sensor values (e.g., y-axis) over time (e.g., x-axis). Due to differing times of starting recording the sensor data, some of the sets of sensor data over time may be offset (e.g., time shift, in the x-axis). In some embodiments, the processing logic tracks trace-to-trace differences and autonomously adjusts guardband variance horizontally when a normal time shifting variance is found. This prevents false positives when a recipe step or trace slightly shifts. This increases the robustness and reduces false positives.

Figure 5C:
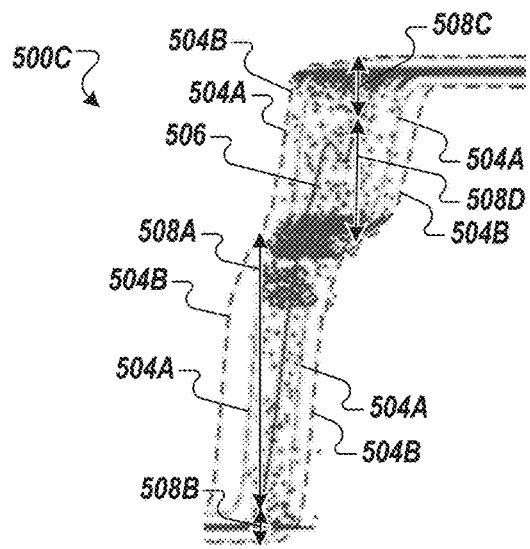

In some embodiments, block 204 includes processing logic determining an upper limit different from a lower limit based on the trace data at block 212 (see FIG. 5C). In some embodiments, the allowable types of variance include a first allowable type of variance to form the upper limit of the guardband and a second allowable type of variance to form the lower limit of the guardband. The first allowable type (e.g., quantity) of variance may be different from the second allowable type (e.g., quantity) of variance. Variation on each side of the guardband is to be computed separately (e.g., during signal transitions) and reduces false positives.

Figure 5D:
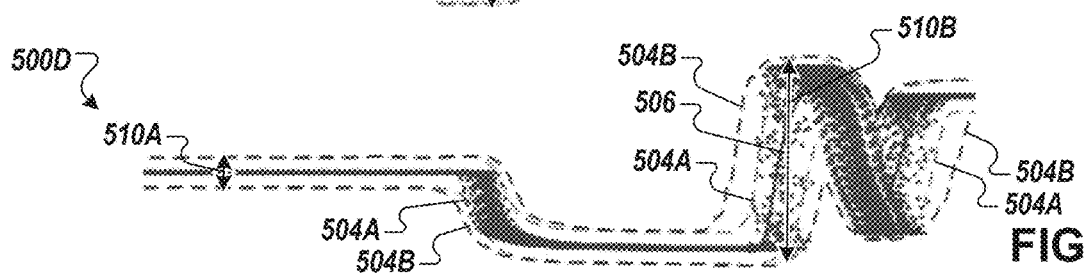

In some embodiments, block 204 includes processing logic determining position-dependent variance of the trace data at block 214 (see FIG. 5D). Parameters and weighting (e.g., duration, level, area, concatenation of successive violations, etc.) and other guardband settings can be adjusted as a function of the position (e.g., along x-axis) in the guardband. Examples include: 1) adjusting along the x-axis corresponding to different operations along a process so the guardband is more/less sensitive or adaptive; 2) adjusting guardband as a function of the characteristics of the signal (e.g., less aggressive in an area where guardband is changing rapidly in the y-direction and more aggressive in an area where the guardband value is relatively constant); 3) adjusting guardband as a function of alarms detected along the guardband (e.g., adjusting the distribution parameters after a first spike is detected to be more or less sensitive to future spike features on that trace); etc. This improves guardband performance and further allows subject matter expertise incorporation into guardband analysis.

Figure 5E:
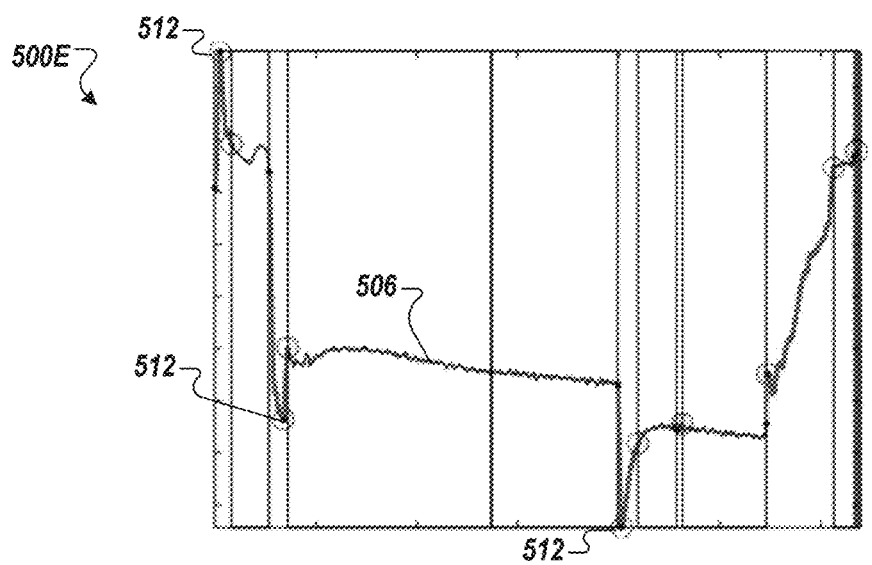

In some embodiments, block 204 includes processing logic determining trace segmentation of the trace data at block 216 (see FIG. 5E). In some embodiments, the allowable types of variance are further based on segmentation of portions of the trace data (e.g., associated with change in values that exceeds a threshold change, values within the threshold). For example, a feature (e.g., within a threshold) may trigger a wider guardband for a next segment of the guardband. In some embodiments, the allowable types of variance are further based on extraction of features from the trace data.

In some embodiments, block 204 includes processing logic performing feature extraction (e.g., semi-auto feature extraction (SFE)) of the trace data at block 218. For example, the guardband parameters may be changed for different segments or for different features. This improves guardband performance and overall analysis by allowing the combining of different capabilities (e.g., guardband, feature extraction, and/or trace segmentation).

In some embodiments, the trace data includes sensor data from different types of sensors and the allowable types of variance is via MVA. MVA metric combining values of multiple sensors into a single metric (e.g., first principal component in principal component analysis (PCA)). Guardband parameters may be applied across multiple guardbands using MVA techniques. Examples include: 1) determining violations and violation distributions as function of violation characteristics across two or more traces occurring (or not occurring) simultaneously; and/or 2) dynamics associated with a guardband for a signal based on that signal for one or more other signals. This improves guardband performance, further allows subject matter expertise incorporation into guardband analysis, and allows addressing of correlation across multiple signals.

In some embodiments, the features include one or more of: persistent features (e.g., ramps and flats); user defined features (e.g., concatenation of ramps and slopes); intermittent features, such as ramps, flats, and FTA features; x-offset; y-offset; shape; length; warping; etc.

At block 205, the processing logic generates, based on the allowable types of variance, a guardband. For example, the guardband may allow for time shifts (e.g., in the x-axis), upper limit and lower limit that are different, multi-variable (e.g., multi-variate) analysis, segmentation of portions of the trace data, extraction of features of the trace data, etc. In some embodiments, the guardband is generated by training a machine learning model, as shown in FIG. 2C.

At block 208, the processing logic causes, based on the guardband, performance of a corrective action associated with the substrate processing system. Block 208 may include comparing additional trace data to the guardband to determine whether to perform the corrective action (e.g., see FIG. 2B).

Referring to FIG. 2B, in some embodiments, at block 222, the processing logic identifies trace data associated with substrate production via a substrate processing system (e.g., the same substrate processing system as FIG. 2A). The trace data may be associated with substrates that is unknown whether the property data of the substrates meets threshold values (e.g., good substrates) or do not meet threshold values (e.g., bad substrates). Trace data includes a separate set of sensor data over time for each of the substrates. In some embodiments, trace data includes sensor data (e.g., different types of sensor data) from multiple different sensors for each of the substrates.

At block 224, the processing logic compares the trace data to a guardband that has been generated based on allowable types of variance (e.g., see block 206 of FIG. 2A). The guardband may have an upper limit and a lower limit for data points over time.

At block 226, the processing logic determines one or more data points of the trace data are not within the guardband. The one or more data points may include at least one data point above the upper limit and/or at least one data point below the lower limit (e.g., the data points do not match data points of substrates that have property values that meet threshold values).

At block 228, processing logic causes performance of a corrective action associated with the substrate processing system. In some embodiments, the corrective action includes providing an alert, interrupting substrate processing equipment, causing inspection of the substrate, discarding the substrate, updating manufacturing parameters, etc. In some embodiments, the performance of the corrective action is specific to the type or quantity of data points that are outside of the guardband.

Referring to FIG. 2C, in some embodiments, at block 242, the processing logic identifies historical trace data associated with production, via a substrate processing system, of substrates. In some embodiments, the substrates (e.g., good substrates) have property values that meet threshold values. Block 242 may be similar to block 202 of FIG. 2A. In some embodiments, the substrates (e.g., bad substrates) have property values that do not meet threshold values.

In some embodiments, at block 244, the processing logic identifies historical performance data associated with the historical trace data. In some examples, the historical performance data is indicates whether the substrates are good substrates or are bad substrates (e.g., all the substrates have property values that meet threshold values, all of the substrates have property values that do not meet threshold values).

At block 246, the processing logic trains a machine learning model with data input including the historical trace data (e.g., and target output including the historical performance data) to generate a trained machine learning model indicative of a guardband associated with allowable types of variance. The training of the machine learning model may cause the guardband to be based on the allowable types of variance described in block 204 of FIG. 2A.

The trained machine learning model may be used to determine whether additional trace data meets the guardband (e.g., see FIG. 2D).

Referring to FIG. 2D, in some embodiments, at block 262, the processing logic identifies trace data associated with substrate production via a substrate processing system (e.g., the same substrate processing system as FIG. 2C). The trace data may be associated with substrates that is unknown whether the property data of the substrates meets threshold values (e.g., good substrates) or do not meet threshold values (e.g., bad substrates). Block 262 may be similar to block 242 of FIG. 2B.

At block 264, the processing logic provides the trace data as input to a trained machine learning model (e.g., trained machine learning model of FIG. 246 of FIG. 2C) associated with a guardband generated based on allowable types of variance.

At block 266, the processing logic receives from the trained machine learning model, output indicative of predictive data.

At block 268, the processing logic determines, based on the predictive data, that one or more data points of the trace data are not within the guardband of the trained machine learning model. The one or more data points may be above the upper limit of the guardband or may be below the lower limit of the guardband.

At block 270, the processing logic causes, based on the predictive data, performance of a corrective action associated with the substrate processing system. Block 270 may be similar to block 228 of FIG. 2B.

Figure 3A:
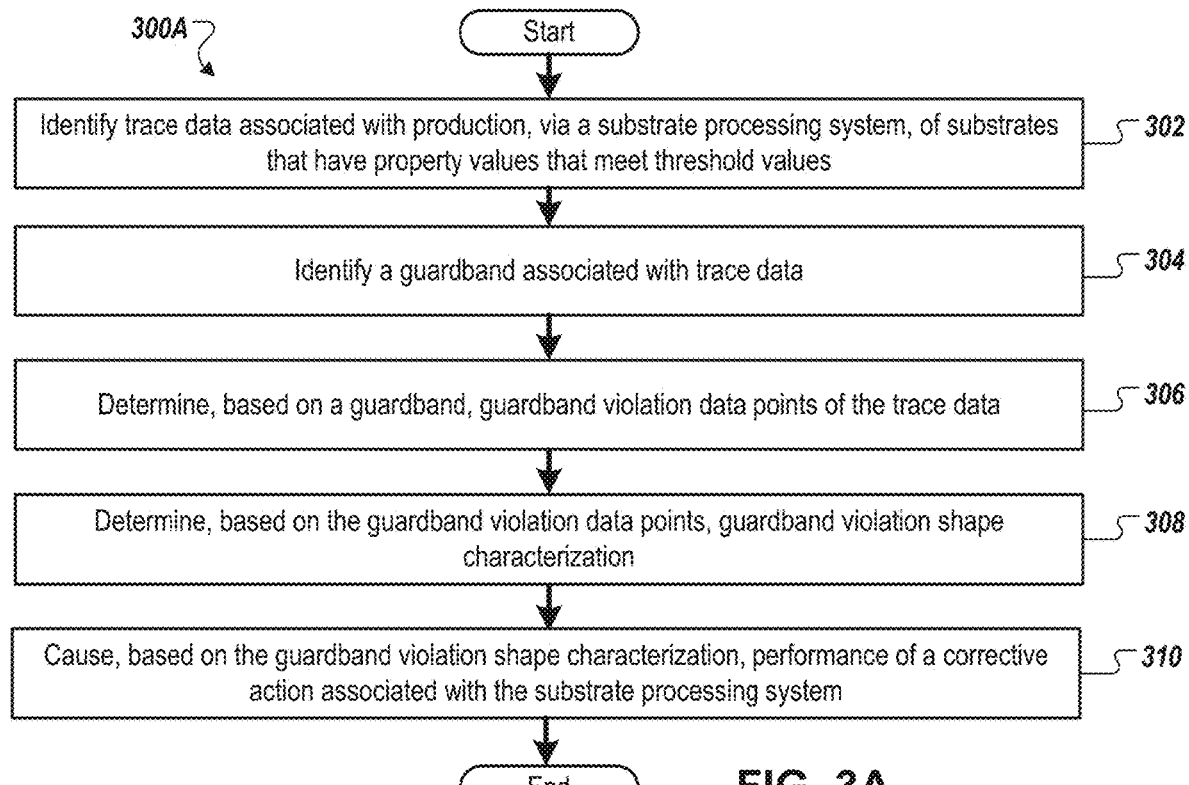
FIGS. 3A-D are flow diagrams of methods associated with guardband violation profiling, according to certain embodiments.
Figure 3B:
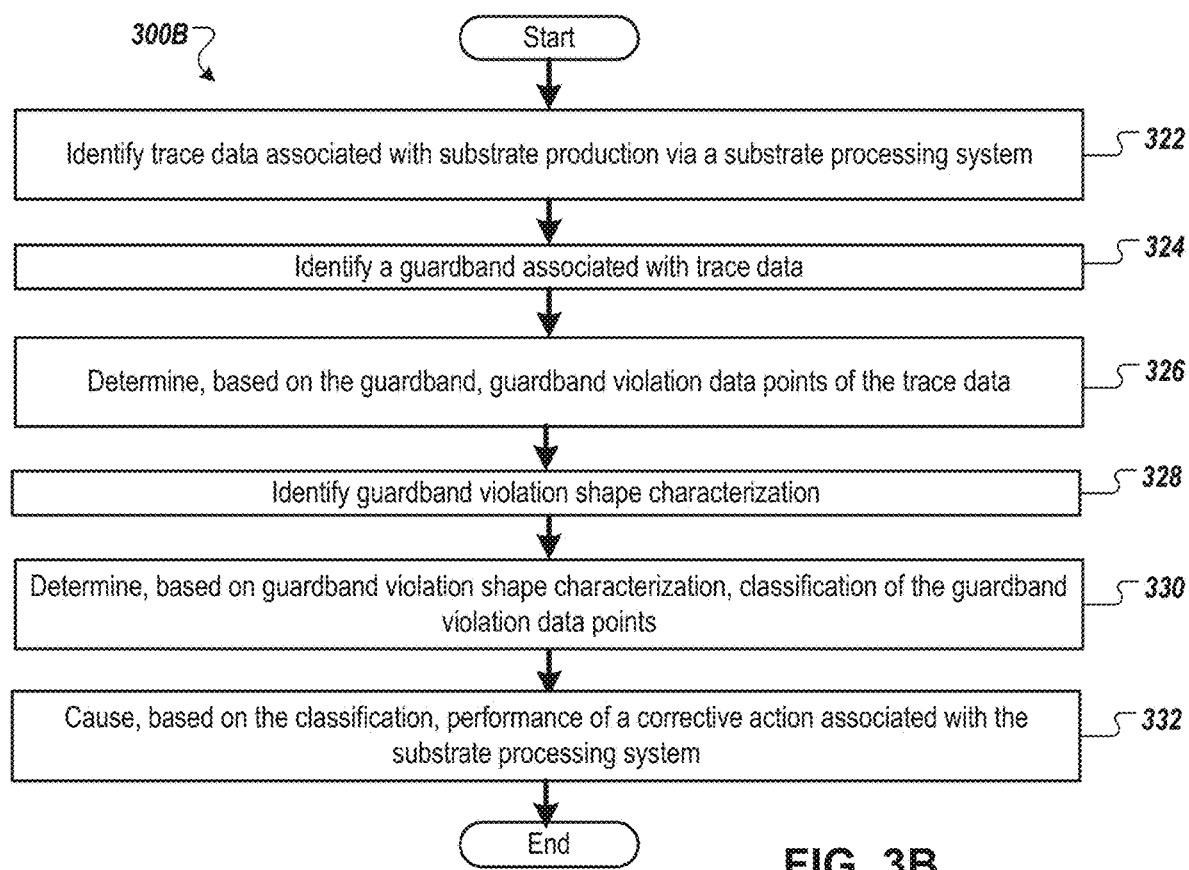
Figure 3C:
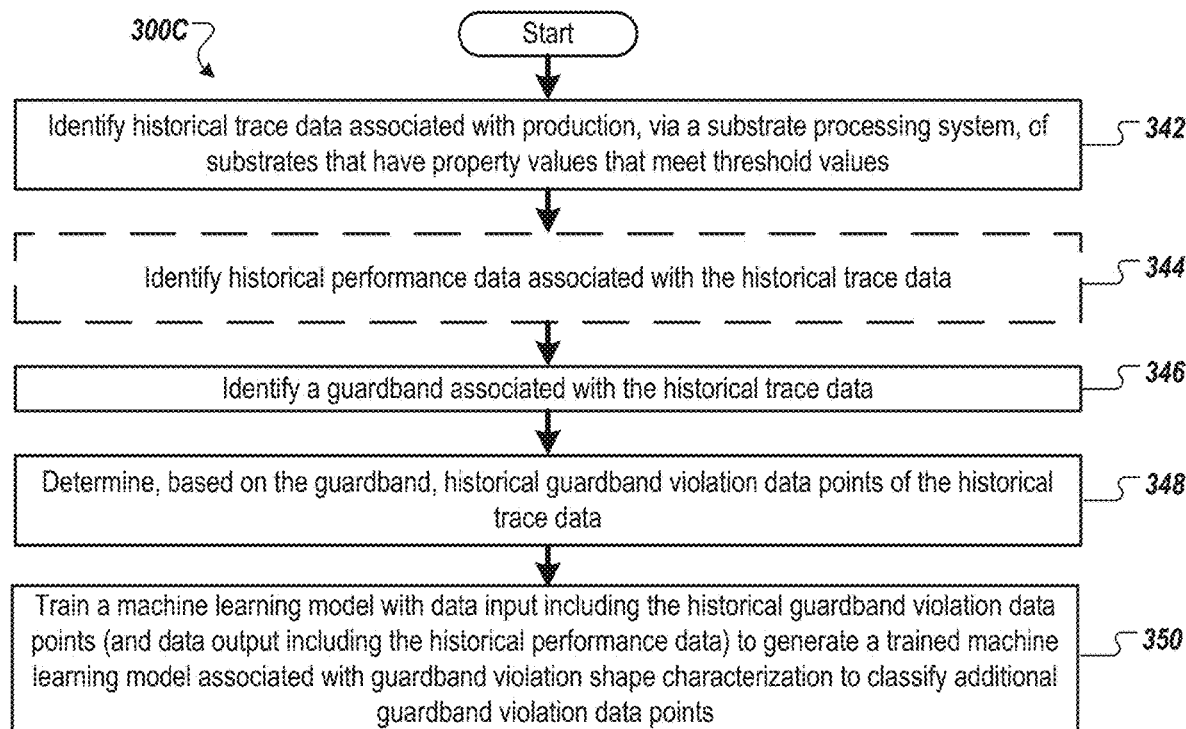
Figure 3D:
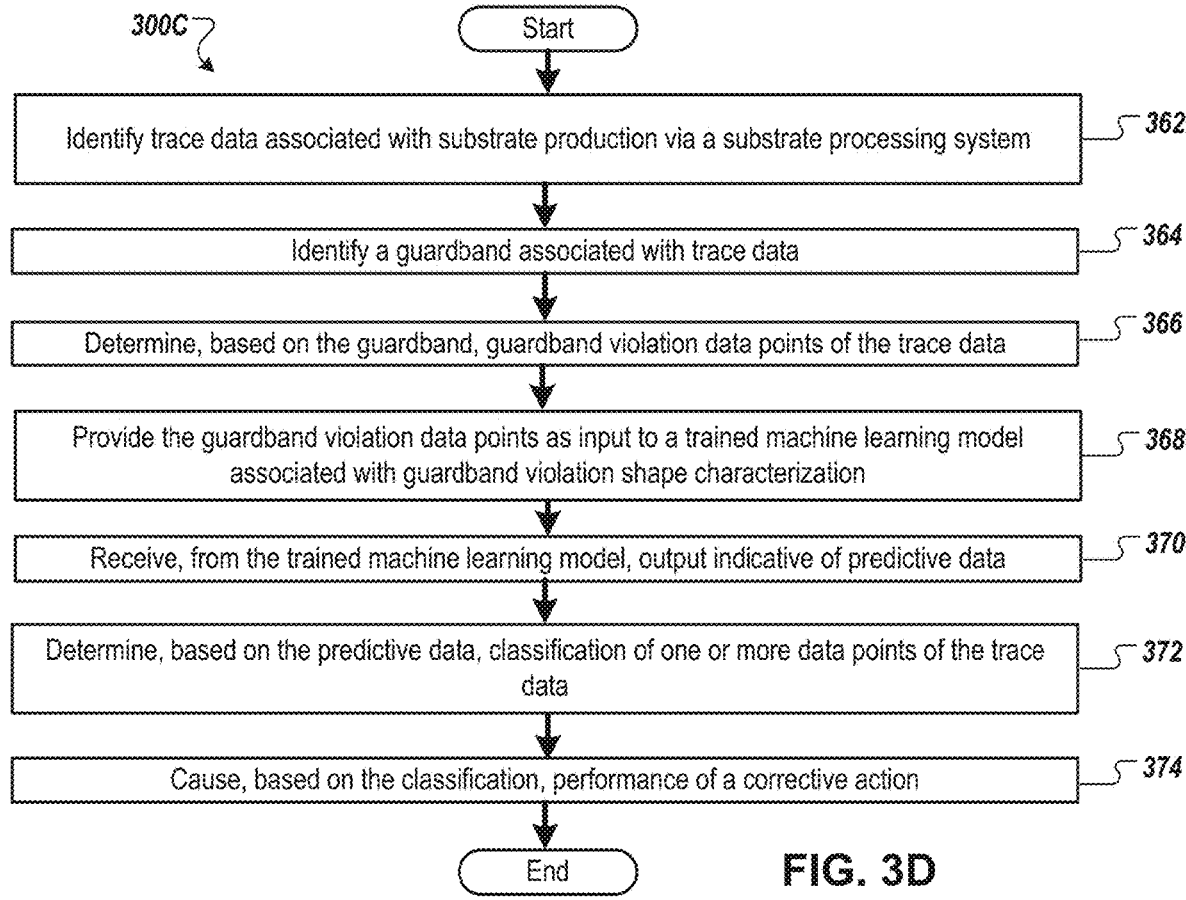

FIGS. 3A-D are flow diagrams of methods associated with guardband violation profiling, according to certain embodiments. FIG. 3A is a flow diagram of a method 300A associated with determining guardband violation shape characterization to classify guardband violation data points, FIG. 3B is a flow diagram of a method 300B associated with classifying guardband violation data points based on guardband violation shape characterization, FIG. 3C is a flow diagram of a method 300C associated with training a machine learning model for classifying guardband violation data points, and FIG. 3D is a flow diagram of a method 300D associated with using a trained machine learning model to classify guardband violation data points.

Referring to FIG. 3A, in some embodiments, at block 302, the processing logic identifies trace data associated with production, via a substrate processing system, of substrates (e.g., good substrates) that have property values that meet threshold values. Block 302 may be similar to block 202 of FIG. 2A.

At block 304, the processing logic identifies a guardband associated with the trace data. The guardband may be generated based on method 200A of FIG. 2A or method 200C of FIG. 2C.

At block 306, the processing logic determines, based on the guardband, guardband violation data points of the trace data. The guardband violation data points include data points of the trace data that are above the upper limit of the guardband and/or data points of the trace data that are below the lower limit of the guardband.

In some embodiments, the trace data is from different types of sensors and the determining of the guardband violation data points is via multi-variable (e.g., multi-variate) analysis.

In some embodiments, the determining of the guardband violation data points includes segmentation of portions of the trace data associated with change in values that exceed a threshold change. In some embodiments, the determining of the guardband violation data points includes extraction of features from the trace data.

At block 308, the processing logic determines, based on the guardband violation data points, guardband violation shape characterization (see FIGS. 6A-E).

In some embodiments, the guardband violation shape characterization is a weighted combination of one or more of guardband violation duration (e.g., quantity of sequential guardband violation data points are outside the guardband limits), guardband violation magnitude (e.g., how far above the upper limit or how far below the lower limit the guardband violation data points are), guardband violation area (e.g., area between a line going through the guardband violation data points and the guardband limit), guardband violation position (e.g., location of the guardband violation data points relative to the guardband limits), and/or guardband violation intermittency (e.g., how often the guardband violation data points are above the upper guardband limit and/or the lower guardband limit).

In some embodiments, the determining of the guardband violation shape characterization includes concatenation of successive violations into a single violation. By analyzing behavior between successive violations, it can be better understood if the violations are related or not. Typical analysis may include time between violations, level of return to normalcy between the violations, and the similarity of factors contributing to successive violations (e.g., x-direction shift). Concatenation of successive violations improves the performance of guardband by identifying system problems rather than guardband violations. This reduces the chatter in guardband violation report and allows for subject matter expertise incorporation into guardband analysis.

The guardband violation shape characterization may be used to characterize any guardband feature in terms of parameters that relate to duration, level, area, etc. These parameters can be weighted to better capture particular violation types.

At block 310, the processing logic causes, based on the guardband violation shape characterization, performance of a corrective action associated with the substrate processing system. Block 310 may include classifying additional guardband violation data points of additional trace data based on the guardband violation shape characterization to determine whether to perform the corrective action (e.g., see FIG. 3B).

Referring to FIG. 3B, in some embodiments, at block 322, the processing logic identifies trace data associated with substrate production via a substrate processing system (e.g., the same substrate processing system as FIG. 3A). The trace data may be associated with substrates that is unknown whether the property data of the substrates meets threshold values (e.g., good substrates) or do not meet threshold values (e.g., bad substrates). Block 322 may be similar to block 222 of FIG. 2B.

At block 324, the processing logic identifies a guardband associated with the trace data. Block 324 may be similar to block 304 of FIG. 3A.

At block 326, the processing logic determines, based on the guardband, guardband violation data points of the trace data. The guardband violation data points include data points of the trace data that are above the upper limit of the guardband and/or data points of the trace data that are below the lower limit of the guardband. Block 326 may be similar to block 306 of FIG. 3A.

At block 328, the processing logic identifies guardband violation shape characterization. The guardband violation shape characterization may be determined by block 308 of FIG. 3A. The guardband violation shape characterization may indicate certain types (e.g., shapes, areas, duration, magnitude, positions, intermittency, etc.) of guardband violation are to be classified as an anomaly (e.g., perform a corrective action) or not an anomaly (e.g., not perform a corrective action).

At block 330, the processing logic determines, based on the guardband violation shape characterization, classification of the guardband violation data points. In some embodiments, the classification indicates whether a guardband violation data point is an anomaly or not. In some embodiments, the classification indicates a type of anomaly associated with the guardband violation data point(s). In some embodiments, the classification indicates a type of corrective action to be performed in association with the guardband violation data point(s).

At block 332, the processing logic causes, based on the classification, performance of a corrective action associated with the substrate processing system. Performance of a corrective action of block 332 may be similar to performance of a corrective action of block 228 of FIG. 2B.

Referring to FIG. 3C, in some embodiments, at block 342, the processing logic identifies trace data associated with production, via a substrate processing system, of substrates (e.g., good substrates) that have property values that meet threshold values. Block 302 may be similar to block 202 of FIG. 2A, block 242 of FIG. 2C, and/or block 302 of FIG. 3A.

At block 344, the processing logic identifies historical performance data associated with the historical trace data. In some examples, the historical performance data is indicates whether the substrates are good substrates or are bad substrates (e.g., all the substrates have property values that meet threshold values, all of the substrates have property values that do not meet threshold values). Block 344 may be similar to block 244 of FIG. 2C.

At block 346, the processing logic identifies a guardband associated with the trace data. The guardband may be generated based on method 200A of FIG. 2A or method 200C of FIG. 2C. Block 346 may be similar to block 304 of FIG. 3B.

At block 348, the processing logic determines, based on the guardband, historical guardband violation data points of the historical trace data. The historical guardband violation data points include data points of the historical trace data that are above the upper limit of the guardband and/or data points of the trace data that are below the lower limit of the guardband. Block 348 may be similar to block 306 of FIG. 3A.

At block 350, the processing logic trains a machine learning model with data input including the historical guardband violation data points (e.g., and target output including the historical performance data) to generate a trained machine learning model associated with guardband violation shape characterization to classify additional guardband violation data points. The trained machine learning model may be used by FIG. 3D. In some embodiments, the guardband violation data points and violation shape characterization (e.g., shape summary statistics) are provided to the trained machine learning model to classify the guardband violation data points. In some embodiments, the guardband violation shape characterization is determined based on the guardband violation data points (e.g., see block 308 of FIG. 3B).

Referring to FIG. 3D, in some embodiments, at block 362, the processing logic identifies trace data associated with substrate production via a substrate processing system (e.g., the same substrate processing system as FIG. 3C). The trace data may be associated with substrates that is unknown whether the property data of the substrates meets threshold values (e.g., good substrates) or do not meet threshold values (e.g., bad substrates). Block 362 may be similar to block 342 of FIG. 3B.

At block 364, the processing logic identifies a guardband associated with the trace data. Block 364 may be similar to block 304 of FIG. 3A, block 324 of FIG. 3B, and/or block 344 of FIG. 3C.

At block 366, the processing logic determines, based on the guardband, guardband violation data points of the trace data. The guardband violation data points include data points of the trace data that are above the upper limit of the guardband and/or data points of the trace data that are below the lower limit of the guardband. Block 366 may be similar to block 306 of FIG. 3A, block 326 of FIG. 3B, and/or block 346 of FIG. 3C.

At block 368, the processing logic provides the guardband violation data points as input to a trained machine learning model (e.g., trained via block 350 of FIG. 3C) that is associated with guardband violation shape characterization. In some embodiments, the guardband violation data points and guardband violation shape characterization (e.g., shape summary statistics) are provided as input to the trained machine learning model to classify the guardband violation data points. In some embodiments, the guardband violation shape characterization is determined based on the guardband violation data points (e.g., see block 308 of FIG. 3B).

At block 370, the processing logic receives, from the trained machine learning model, output indicative of predictive data.

At block 372, the processing logic determines, based on the predictive data, classification of one or more data points of the trace data. The classification of block 372 may be similar to the classification of block 330 of FIG. 3B.

At block 384, the processing logic causes, based on the classification, performance of a corrective action associated with the substrate processing system. Block 384 may be similar to block 332 of FIG. 3B.

Figure 4A:
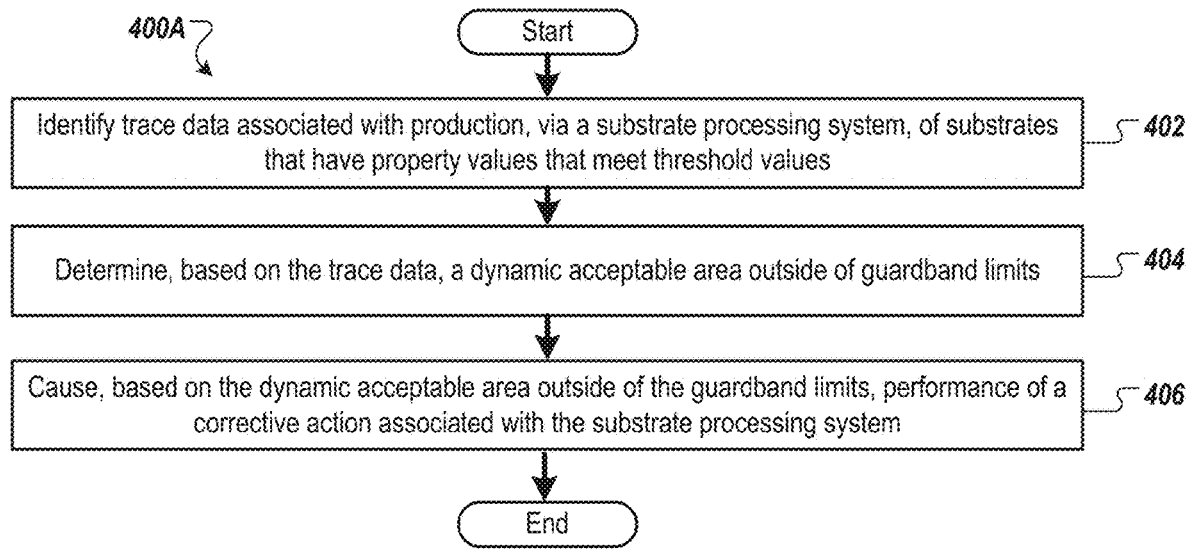
FIGS. 4A-D are flow diagrams of methods associated with dynamic acceptable areas outside of guardband limits, according to certain embodiments.
Figure 4B:
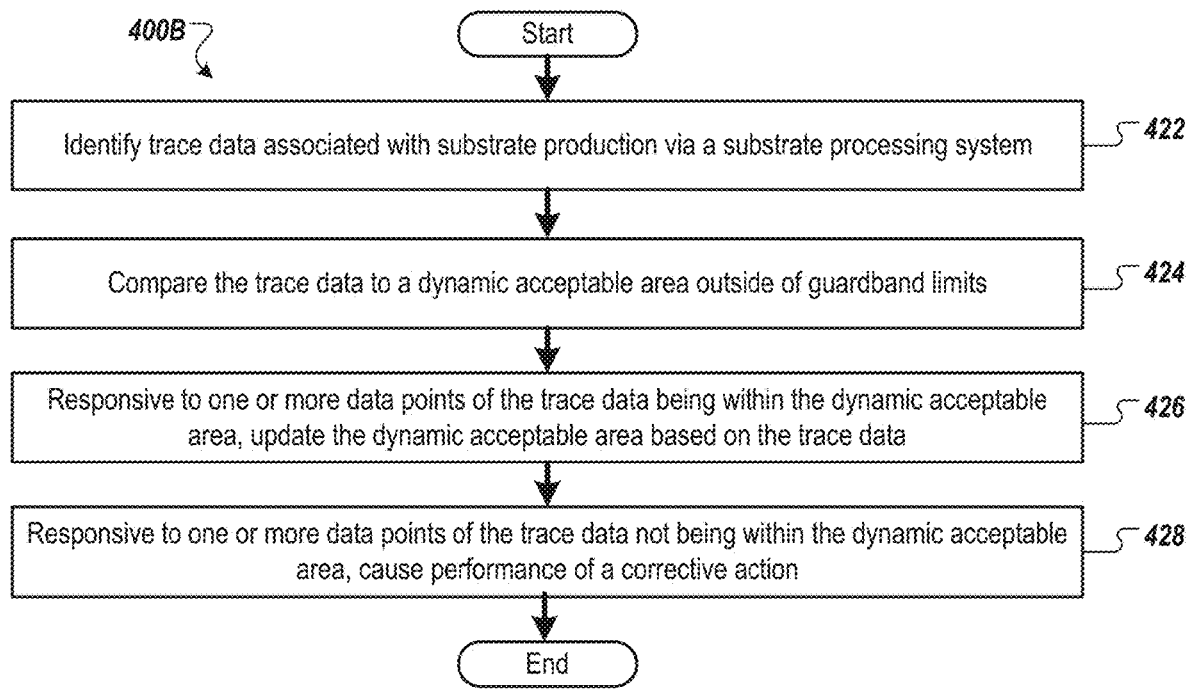
Figure 4C:
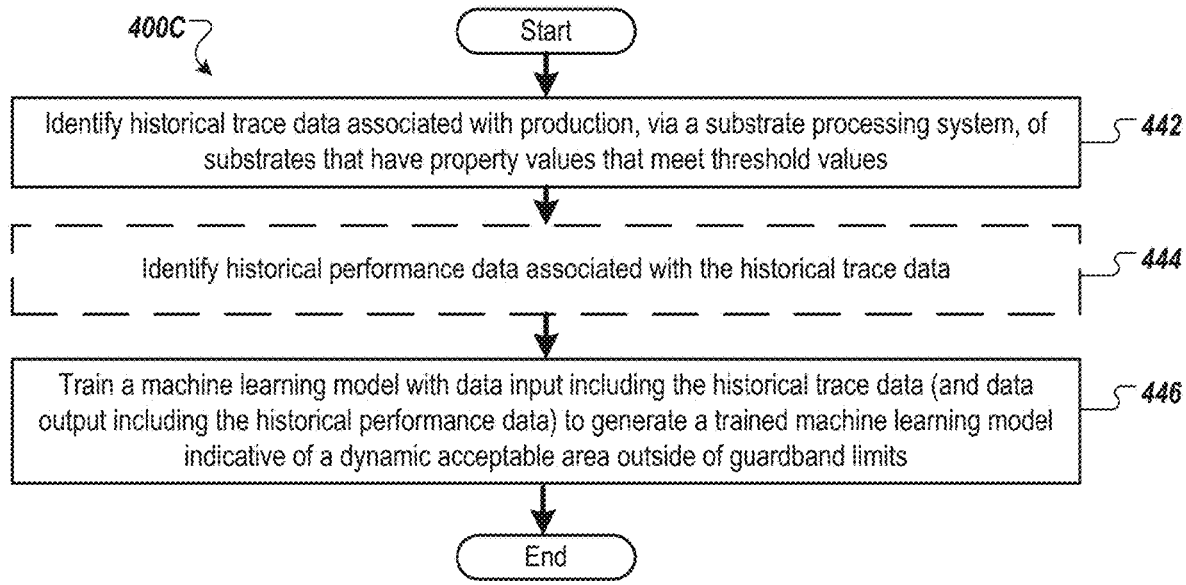
Figure 4D:
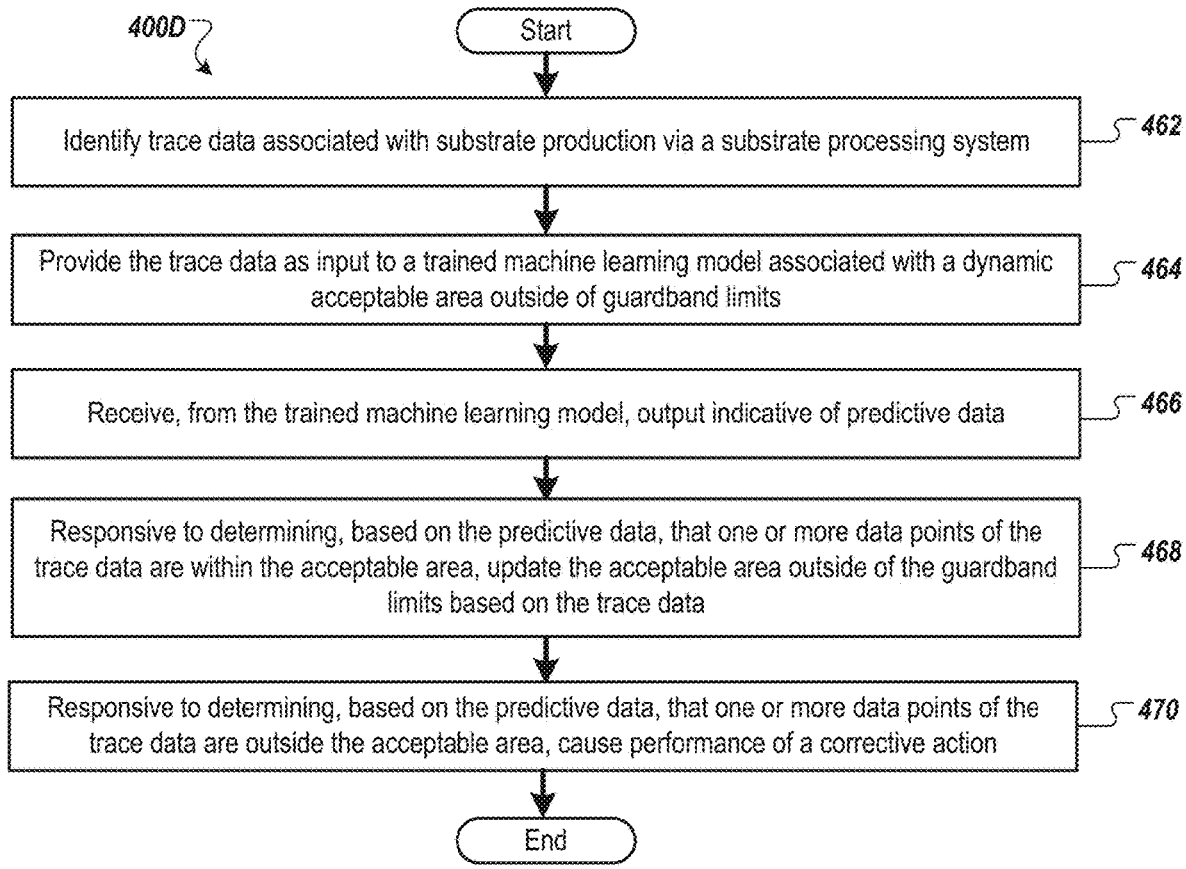

FIGS. 4A-D are flow diagrams of methods associated with dynamic acceptable areas outside of guardband limits (e.g., time dependent variation of trace data), according to certain embodiments. FIG. 4A is a flow diagram of a method 400A associated with determining acceptable areas outside of guardband limits, FIG. 4B is a flow diagram of a method 400B associated with using and possibly adjusting acceptable areas outside of guardband limits, FIG. 4C is a flow diagram of a method 400C associated with training a machine learning model for determining acceptable areas outside of guardband limits, and FIG. 4D is a flow diagram of a method 400D associated with using a trained machine learning model to use and possibly adjust acceptable areas outside of guardband limits.

Trace data of good wafers may change over time due to acceptable drift, oscillation, noise, spike, etc.

Referring to FIG. 4A, in some embodiments, at block 402, the processing logic identifies trace data associated with production, via a substrate processing system, of substrates (e.g., good substrates) that have property values that meet threshold values. Block 302 may be similar to block 202 of FIG. 2A and/or block 302 of FIG. 3A.

At block 404, the processing logic determines, based on the trace data, a dynamic acceptable area outside of guardband limits.

In some embodiments, the processing logic determines upper and lower limits of a guardband based on the trace data (e.g., via block 206 of FIG. 2A, via block 246 of FIG. 2C, via 3 sigma off of an average of the trace data, etc.). The area between the upper and lower limits of the guardband is a safe area (e.g., green area) where data points in this area is considered as healthy.

The processing logic determines an acceptable area outside of the guardband limits. The acceptable area may be an alert area (e.g., yellow area) where data points are still normal and are used to track dynamics of the substrate processing system. An abnormal area (e.g., red area) is outside of the acceptable area and data points within the abnormal area are considered as a positive (e.g., anomaly).

The acceptable area may be determined via user input (e.g., 1 sigma outside of the guardband limits, 4 Angstroms sensor data variation, 4% sensor data variation, etc.). The acceptable area may vary over time (e.g., dynamic acceptable area). In some embodiments, for a predetermined amount of time (e.g., predetermined amount of runs), a predetermined amount of sensor value variation from the guardband limits may be acceptable. For example, for ten runs, a 4 Angstrom or 4% change in sensor values from the guardband limits may be acceptable.

The dynamic acceptable area and/or the guardband limits may change over time. For example, over a predetermined amount of runs (e.g., 10 runs), the acceptable area and/or guardband limits may adjust by a predetermined amount (e.g., rise 4 Angstroms, widen by 4%, etc.). As the dynamic acceptable area and/or guardband limits change over time, the new acceptable area may be updated.

At block 406, the processing logic causes, based on the dynamic acceptable area outside of the guardband limits, performance of a corrective action associated with the substrate processing equipment. The performance of a corrective action may be based on additional trace data being outside of the acceptable area (see FIG. 4B).

Referring to FIG. 4B, in some embodiments, at block 422, the processing logic identifies trace data associated with substrate production via a substrate processing system (e.g., the same substrate processing system as FIG. 4A). The trace data may be associated with substrates that is unknown whether the property data of the substrates meets threshold values (e.g., good substrates) or do not meet threshold values (e.g., bad substrates). Block 422 may be similar to block 222 of FIG. 2B and/or block 322 of FIG. 3B.

At block 424, the processing logic compares the trace data to a dynamic acceptable area outside of guardband limits. The dynamic acceptable area may be determined by block 404 of FIG. 4A.

At block 426, the processing logic updates the dynamic acceptable area outside of the guardband limits based on the trace data responsive to one or more data points of the trace data being within the dynamic acceptable data.

At block 428, the processing logic causes performance of a corrective action associated with the substrate processing equipment responsive to one or more data points of the trace data being outside of the dynamic acceptable data. The performance of the corrective action of block 428 may be similar to performance of a corrective action of block 228 of FIG. 2B and/or block 332 of FIG. 3B.

Referring to FIG. 4C, in some embodiments, at block 442, the processing logic identifies trace data associated with production, via a substrate processing system, of substrates (e.g., good substrates) that have property values that meet threshold values. Block 302 may be similar to block 202 of FIG. 2A, block 242 of FIG. 2C, block 302 of FIG. 3A, block 342 of FIG. 3C, and/or block 402 of FIG. 4A.

At block 444, the processing logic identifies historical performance data associated with the historical trace data. In some examples, the historical performance data is indicates whether the substrates are good substrates or are bad substrates (e.g., all the substrates have property values that meet threshold values, all of the substrates have property values that do not meet threshold values). Block 444 may be similar to block 244 of FIG. 2C and/or block 344 of FIG. 3C.

At block 446, the processing logic trains a machine learning model with data input including the historical trace data (e.g., and target output including the historical performance data) to generate a trained machine learning model indicative of a dynamic acceptable area outside of guardband limits. The trained machine learning model may be used by FIG. 4D.

Referring to FIG. 4D, in some embodiments, at block 462, the processing logic identifies trace data associated with substrate production via a substrate processing system (e.g., the same substrate processing system as FIG. 4C). The trace data may be associated with substrates that is unknown whether the property data of the substrates meets threshold values (e.g., good substrates) or do not meet threshold values (e.g., bad substrates). Block 362 may be similar to block 442 of FIG. 4B.

At block 464, the processing logic provides the trace data as input to a trained machine learning model (e.g., trained machine learning model of FIG. 446 of FIG. 4C) associated with a dynamic acceptable area outside of guardband limits.

At block 466, the processing logic receives from the trained machine learning model, output indicative of predictive data.

At block 468, the processing logic updates the dynamic acceptable area outside of the guardband limits responsive to determining, based on the predictive data, that one or more data points of the trace data are within the acceptable area. Block 468 may be similar to block 426 of FIG. 4B.

At block 470, the processing logic causes performance of a corrective action associated with the substrate processing system responsive to determining, based on the predictive data, that one or more data points of the trace data are outside of the acceptable area. Block 470 may be similar to block 428 of FIG. 4B.

FIGS. 5A-E illustrate graphs 500A-E of allowable types of variance (e.g., see FIGS. 2A-D), according to certain embodiments. FIGS. 5A-B illustrate graphs 500A-B of trace-to-trace variability. FIG. 5C illustrates graph 500C of upper limit different from a lower limit. FIG. 5D illustrates graph 500D of position-dependent variance. FIG. 5E illustrates graph 500E of trace segmentation.

Referring to FIG. 5A, graph 500A illustrates trace data 502A-B. Trace data 502A can be sensor data (e.g., from one or more sensors) for production of a first substrate (e.g., one or more first substrates) and trace data 502B can be sensor data (e.g., from the same one or more sensors) for a second substrate (e.g., one or more second substrates). Capturing of trace data 502B may occur earlier in the substrate production operation than capturing of trace data 502A, causing a shift in the x-direction (e.g., x-axis is time and y-axis is sensor values, trace data 502A shoots up earlier than trace data 502B). This is referred to as trace-to-trace variability (e.g., variance).

Referring to FIG. 5B, graph 500B illustrates trace data associated with production of many substrates over time. A guardband 504A that does not take into account the trace-to-trace variability causes many false positives (e.g., many guardband violation data points that do not correspond to a bad substrate). In some examples, line 506 is calculated by taking an average of the trace data and guardband 504A is created by taking a 3 sigma from line 506, so that guardband 504A is equally distant from line 506 over time. Trace-totrace variability causes many false positives of guardband 504A and merely expanding guardband 504A would create many missed positives (e.g., data points that deviate in the y-direction would not be captured if the guardband 504A were expanded.

Through method 200A of FIG. 2A or method 200C of FIG. 2C, guardband 504B is generated that takes into consideration trace-to-trace variability. Trace data from good substrates is used to determine allowable types of variability. For example, an initial guardband 504A can be made from the trace data from good substrates and then, since the substrates all have property values that meet threshold values, the guardband 504A is widened in the x-direction (e.g., expands horizontally) in areas to form guardband 504B to accommodate for trace-to-trace variability.

Referring to FIG. 5C, graph 500C illustrates graph 500C of upper limit different from a lower limit.

As discussed in FIG. 5B, a guardband 504A may have an upper limit and a lower limit (e.g., 3 sigma) that are equally distanced from a line 506 that goes through an average of the trace data. Trace data from good wafers may have different amounts of variance above and below the line 506. By only equally distancing upper and lower limits of the guardband 504A, there may be many false positives.

Through method 200A of FIG. 2A or method 200C of FIG. 2C, guardband 504B is generated that takes into consideration an upper limit and a lower limit that are different from each other. For example, as illustrated in FIG. 5C, there may be a larger upper side variance 508A in the beginning of the transition than lower side variance 508B and there may be a larger lower side variance 508D in the end of a transition than upper side variance 508C.

Referring to FIG. 5D, graph 500D illustrates graph 500D of position-dependent variance.

As discussed in FIG. 5B, a guardband 504A may have an upper limit and a lower limit (e.g., 3 sigma) that are the same distance over time from a line 506 that goes through an average of the trace data. Trace data from good wafers may have different amounts of variance at different portions of time. By having the same sized guardband 504A over time, there may be many false positives.

Through method 200A of FIG. 2A or method 200C of FIG. 2C, guardband 504B is generated that takes into consideration differing amounts of variance 510 over time. For example, as illustrated in FIG. 5D, there may be a lower variance 510A (e.g., less distance between upper and lower limits of guardband 504B for good substrates) in the flat region and a higher variance 510B (e.g., higher distance between upper and lower limits of guardband 504B for good substrates) in a transient region.

Referring to FIG. 5E, graph 500E illustrates graph 500E of trace segmentation. As discussed in FIG. 5B, a guardband 504A may have an upper limit and a lower limit (e.g., 3 sigma) that are the same distance over time from a line 506 that goes through an average of the trace data. In some embodiments, change in trace data is greater than a threshold amount (e.g., see areas 512 in FIG. 5E).

If two boundaries are close to each other, a median position may be used. If one of the boundaries is close to a boundary that has a change that is greater than a threshold amount, that segment boundary may be maintained.

Two segments of the trace data that show a sharp change in original bounds may not be removed from the trace data. Parameters of the guardband may be adjusted based on segmentation knowledge of sharp change segmentation points in areas 512.

A sharp change of area 512 may be one or more of:
1) a slope change of segments of the trace data from negative to positive or from positive to negative (e.g., slope(right)*slope(left)<0);
2) slope of right segment and/or left segment exceeds a threshold slope (e.g., abs (slope(right))>0.1 or abs (slope(left))>0.1 (in normal value)); and/or
3) average variance (e.g., standard deviation) of two connecting segments is a threshold amount greater than an average variance (e.g., standard deviation) of the next two segments) (e.g., mean(std[right,left])>2*mean (std[right_2,left_2]).

If two adjacent segments of the trace data have 1), 2), and 3) from above, then the segment boundary (e.g., data points in area 512) may be considered a fixed boundary. In some embodiments, area 512 being a segment boundary causes the guardband 504B to be generated for the points in areas 512 instead of removing the data points in 512 from guardband 504B generation. In some embodiments, area 512 being a segment boundary causes the data points in area 512 to be a limit of guardband 504B that has a smaller allowable variance.

FIGS. 6A-E illustrate guardband violation profiling (e.g., see FIGS. 3A-D), according to certain embodiments.

Figure 6A:
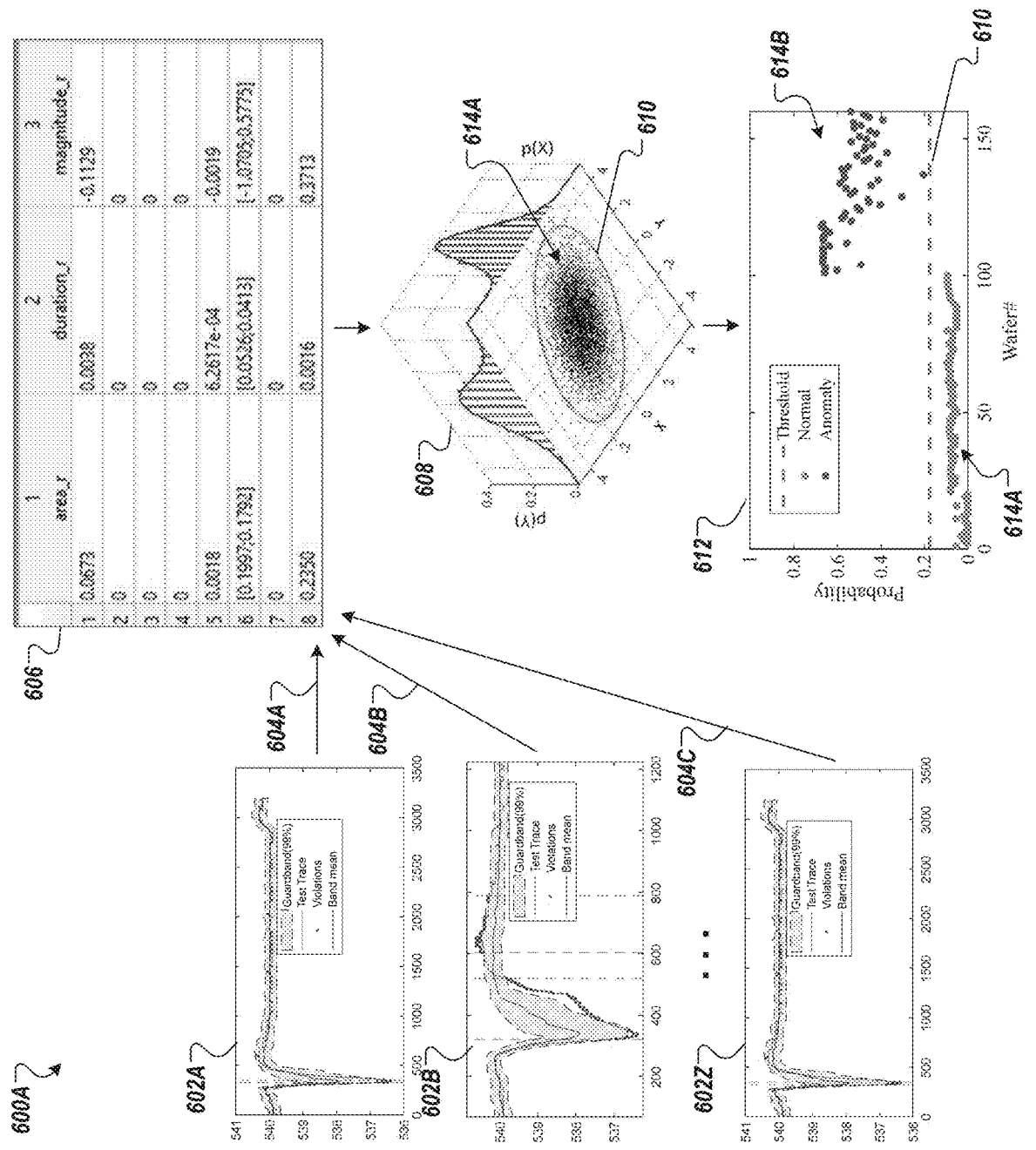

Referring to FIG. 6A, trace data is shown on each of graphs 602A-Z (e.g., block 302 of FIG. 3A, block 344 of FIG. 3C). Each graph 602A-Z may illustrate trace data for production of a different substrate, where each substrate is a good substrate (e.g., has property values that meet threshold values). Each graph 602A-Z also illustrates a guardband and each graph 602A-Z has some sets of data points that fall outside of the guardband limits. These sets of data points are referred to as sets of guardband violation data points 604A-Z (e.g., sets of data points associated with guardband violation). Since the trace data is for good substrates, the sets of guardband violation data points 604A-Z violate the guardband, but are not indicative of bad substrates (e.g., they are false positives).

Parameters 606 are extracted for each set of guardband violation data points 604 of the trace data. Parameters 606 may include area, duration, magnitude, etc. In some examples, area can be an area between a guardband limit and a portion of a line going through the trace data that is outside the guardband limit. In some examples, duration can be the amount of time that sequential guardband violation data points are outside of the guardband limits. Magnitude can be the magnitude (e.g., y value) of difference between a guardband violation data point and a guardband limit (e.g., in the y-direction). In some examples, each guardband violation data point may have corresponding parameter inputs.

The parameters 606 and the joint probability density function of the parameters 606 may be used to form a graph 608. The graph 608 may be generated by fitting multivariate Gaussian distribution (e.g., find joint probability density function of the three variables). The sets of guardband violation data points 604 may form a guardband violation shape characterization 610 (e.g., circle on graph 608) that surrounds the sets of guardband violation data points 604 (e.g., good guardband violation data points 614A).

The graph 608 that includes the guardband violation shape characterization 610 can be used to generate graph 612. The graph 12 displays the guardband violation shape characterization 610 that separates good guardband violation data points 614A that correspond to good substrates and bad guardband violation data points 614B that correspond to bad substrates.

Responsive to the sets of guardband violation data points 604 being for good substrates, the guardband violation shape characterization 610 surrounds (e.g., encircles) data points of good substrates in graph 608. The guardband violation shape characterization 610 can be used to determine whether future sets of guardband violation data points 604 are good guardband violation data points 614A that correspond to good substrates (e.g., inside the guardband violation shape characterization 610 on graph 608, below guardband violation shape characterization 610 on graph 612) or substrates that are not good (e.g., outside the guardband violation shape characterization 610 on graph 608, above guardband violation shape characterization 610 on graph 612).

In some embodiments, the sets of guardband violation data points 604 used for parameters 606, graph 608, and graph 612 correspond to bad substrates (e.g., substrates that have property values that do not meet threshold values). The guardband violation shape characterization 610 then surrounds (e.g., encircles) data points of bad substrates in graph 608. The guardband violation shape characterization 610 can be used to determine whether future substrates are bad (e.g., inside the guardband violation shape characterization 610 on graph 608, below guardband violation shape characterization 610 on graph 612) or not bad (e.g., outside the guardband violation shape characterization 610 on graph 608, above guardband violation shape characterization 610 on graph 612).

Responsive to the sets of guardband violation data points 604 being for a specific type of substrates (e.g., specific type of bad, substrates that have specific property values that do not meet threshold values), the guardband violation shape characterization 610 surrounds (e.g., encircles) data points of a specific type of substrates. The guardband violation shape characterization 610 can be used to determine whether future substrates are a specific type of substrates (e.g., inside the guardband violation shape characterization 610 on graph 608, below guardband violation shape characterization 610 on graph 612) or not the specific type of substrates (e.g., outside the guardband violation shape characterization 610 on graph 608, above guardband violation shape characterization 610 on graph 612).

FIG. 6B illustrates a graph 620 for guardband violation profiling, according to certain embodiments. Graph 620 includes a band mean 622 (e.g., average trace data), guardband limit 624, offset 626 between guardband limit 624 and band mean 622, and guardband violation data points 628. Graph 620 has a gap 638 between a first instance of guardband violation data points 628A and a second instance of guardband violation data points 628B.

Violation duration 630 of the guardband violation data points 628 is a distance (e.g., in the x-direction, lasting time of violation) between a first guardband violation data point 628A outside of the guardband limit 624 and a last guardband violation data point 628B outside of the guardband limit 624.

Violation magnitude 632 (e.g., maximum violation, peak of violation) is a distance between the guardband limit 624 and a guardband violation data point 628 (e.g., furthest guardband violation data point 628 in the y-direction from the guardband limit 624).

Violation area 634 is an area (e.g., mean value of violation) between a line that goes through the guardband violation data points and the guardband limit 624.

Violation position 636 can be a position (e.g., x-value, time value, where the violation is) of the maximum violation magnitude 632.

Violation intermittency can include combining or splitting two or more violations.

The guardband violation shape characterization 610 may be further based on one or more of the violation duration 630, violation magnitude 632, violation area 634, and/or violation position 636. A guardband violation data point 628 that corresponds to a violation duration 630, violation magnitude 632, violation area 634, and/or violation position 636 that meets a threshold value may be disregarded. A guardband violation data point 628 that corresponds to a violation duration 630, violation magnitude 632, violation area 634, and/or violation position 636 that meets a threshold value may correspond to a type of substrate (e.g., good substrate, bad substrate, type of bad substrate, etc.).

FIG. 6C illustrates a graph 640 for guardband violation profiling, according to certain embodiments. Graph 640 includes a band mean 622 (e.g., average trace data), guardband limit 624, instances of guardband violation data points 628, a gap 638 between two instances of guardband violation data points 628, and a violation magnitude 632 between band mean 622 and a last guardband violation data point 628 of the first instance of guardband violation data points 628. A line 642 is between the last guardband violation data point of the first instance of guardband violation data points 628C and a data point of the band mean 622 corresponding to the first guardband violation data point of the second instance of guardband violation data points 628D.

The guardband violations shape characterization 610 may classify a substrate or trace data as good, bad, or type of bad based on the number of violations. Responsive to length of line 642 meeting a threshold value (e.g., being big enough), the first instance of guardband violation data points 628C and the second instance of guardband violation data points 628D are considered a single violation, otherwise the first instance of guardband violation data points 628C and the second instance of guardband violation data points 628D are considered separate violations.

Figure 6D:
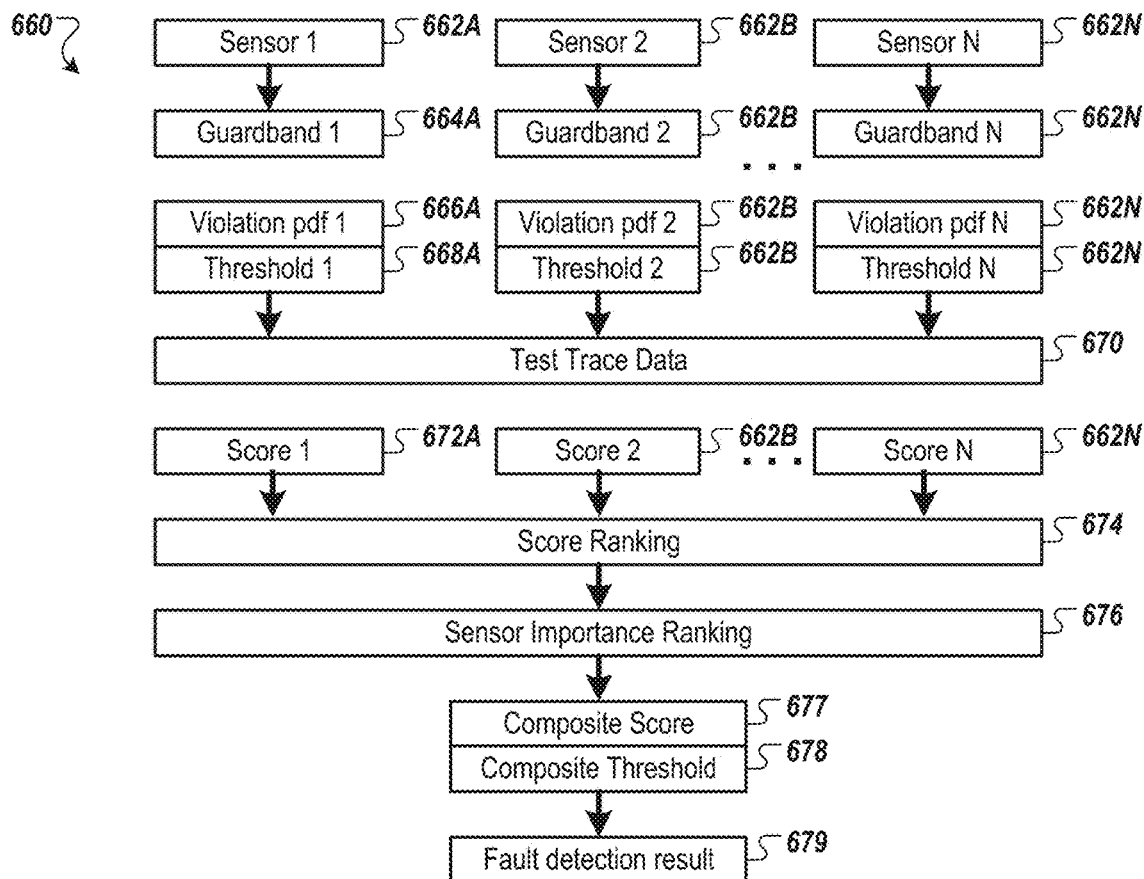

FIG. 6D illustrates a flow diagram of a method 660 for guardband violation profiling, according to certain embodiments. Classification of guardband violation data points can be via multi-variate (e.g., multi-variate) analysis (e.g., based on sensor data from different types of sensors).

In some embodiments, trace data from sensors 662A-N are separately compared to a corresponding guardband 664A-N. Guardband violation data points from the comparison of trace data from sensor 662 compared to guardband 664 is processed via violation probability density function (pdf) 666 and comparing to threshold 668 to provide test trace data 670.

The test trace data provides a score 672 for each sensor 662. Score ranking 674 is performed based on the scores 672. Sensor importance ranking 676 is performed based on the score ranking 674. A composite score 677 is generated based on the sensor importance ranking 676. The composite score 677 is compared to a composite threshold 678 to provide a fault detection result 679 (e.g., classification of the guardband violation data points as being for a good substrate or a bad substrate, anomaly detection result).

Figure 6E:
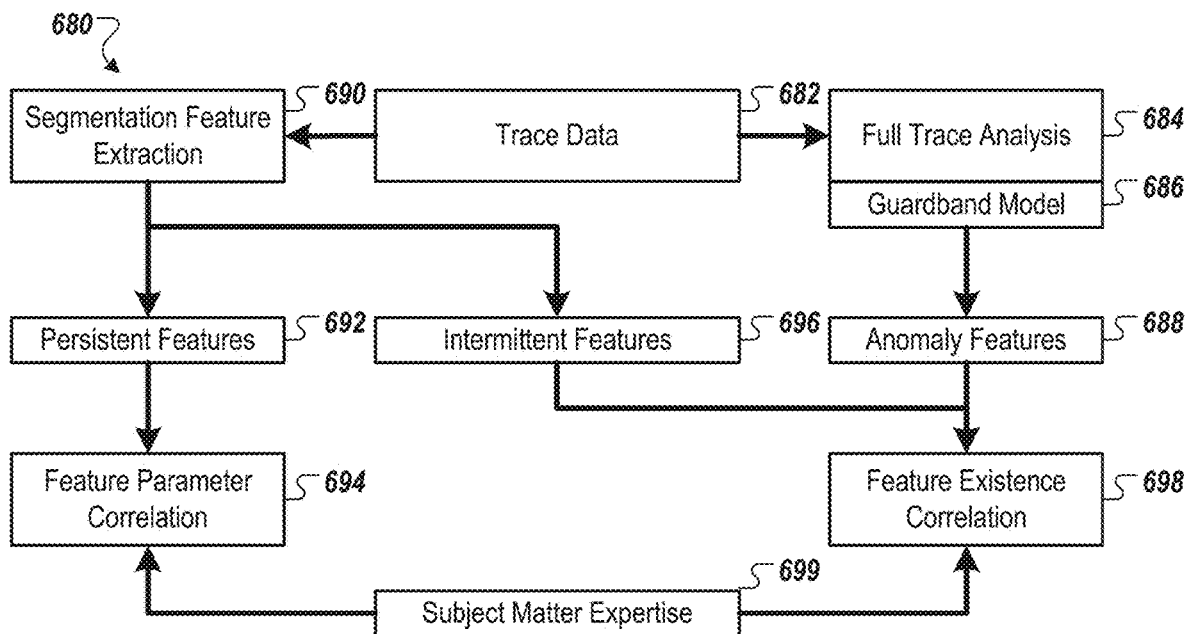

FIG. 6E illustrates a flow diagram of a method 680 for guardband violation profiling, according to certain embodiments. Guardband violation shape characterization may be based on guardband violation data points and segmentation feature extraction.

At block 682, trace data is identified. This may be similar to block 302 of FIG. 3A and/or block 342 of FIG. 3C for generating a guardband. This may be similar to block 322 of FIG. 3B and/or block 362 of FIG. 3D for using a guardband.

At block 684, a full trace analysis is performed on the trace data from block 682. For example, area, duration, magnitude, etc. may be determined (e.g., see FIGS. 6A-C).

At block 686, a guardband model is generated based on the full trace analysis of the trace data. This may be similar to block 206 of FIG. 2A and/or block 246 of FIG. 2C.

At block 688, anomaly features (e.g., guardband violation data points) are determined by comparing the trace data to the guardband model (e.g., the guardband). This may be similar to block 306 of FIG. 3A, block 326 of FIG. 3B, block 346 of FIG. 3C for training a model and/or block 366 of FIG. 3D. The anomaly features (e.g., guardband violation data points) may be persistent or intermittent).

At block 690, segmentation feature extraction is performed on the trace data of block 682. This may be similar to FIG. 5E (e.g., segment boundary, such as data points in area 512 of FIG. 5E, being considered a fixed boundary). In some embodiments, guardband model produces anomaly features of block 688 that may be combined with the features (e.g., persistent features of block 692 and intermittent features of block 692) identified at block 690.

At block 692, persistent features of the trace data are determined based on the segmentation feature extraction of block 690. Persistent features may be features of the trace data that meet a threshold amount of occurrences.

At block 694, feature parameter correlation of the persistent features of the trace data is performed (e.g., based on subject matter expertise 699, such as user input). Feature parameter correlation may be based on parameters such as magnitude, position, area, duration, etc. (see FIG. 6B). In some embodiments, guardband violation shape characterization may classify guardband violation data points corresponding to persistent features as being associated with good substrates.

At block 696, intermittent features of the trace data are determined based on the segmentation feature extraction of block 690. Intermittent features may be features of the trace data that do not meet a threshold amount of occurrences.

At block 698, feature existence correlation is performed based on the intermittent features from block 696, the anomaly features from block 688, and/or the subject matter expertise 699. In some embodiments, guardband violation shape characterization may classify guardband violation data points corresponding to intermittent features as being associated with bad substrates.

FIGS. 7A-F illustrate dynamic acceptable areas outside of guardband limits, according to certain embodiments.

FIG. 7A illustrates a flow diagram of method 700 associated with dynamic areas outside of guardband limits.

At block 702, processing logic identifies baseline trace data. This may be similar to block 302 of FIG. 3A and/or block 342 of FIG. 3C for generating a guardband. This may be similar to block 322 of FIG. 3B and/or block 362 of FIG. 3D for using a guardband.

At block 704, processing logic identifies a guardband based on the trace data. The guardband may be generated by block 206 of FIG. 2A and/or block 246 of FIG. 2C.

At block 706, processing logic performs multi-variable (e.g., multi-variate) analysis (MVA) distribution based on the guardband and baseline trace data.

At block 708, processing logic identifies probability on the baseline trace data. The probability may be a probability of the data points being in a safe area (e.g., area 736 of graph 734 or graph 742 of FIG. 7B), an alert area (e.g., area 738 of graph 734 or graph 742 of FIG. 7B), or an abnormal area (e.g., area 740 of graph 734 or graph 742 of FIG. 7B).

At block 710, processing logic generates an internal threshold. The internal threshold may be a line that separates alert area (e.g., area 738 of graph 734 or graph 742 of FIG. 7B) from abnormal area (e.g., area 740 of graph 734 or graph 742 of FIG. 7B).

At block 712, processing logic generates augmented trace data. Augmented trace data may be simulated trace data formed by adjusting baseline trace data of block 702 by one or more of blocks 714-720.

At block 714, the augmented trace data may include trace data with minor drift. Drift may include increasing the sensor values of the baseline trace data of block 702 in the y-direction.

At block 716, the augmented trace data may include trace data with minor repeating. One or more portions of the baseline trace data of block 702 may be repeated over time (e.g., in the x-direction).

At block 718, the augmented trace data may include trace data with minor noise (e.g., and/or oscillating). The baseline trace data of block 702 may be adjusted (e.g., increased and decreased) in the y-direction to simulate noise.

At block 720, the augmented trace data may include trace data with minor spikes. The baseline trace data of block 702 may include peaks and valleys to simulate minor spikes.

At block 722, processing logic identifies probability on baseline trace data plus augmented trace data. Block 722 may be similar to block 708.

At block 724, processing logic generates an external threshold. Block 724 may be similar to block 710.

FIG. 7B illustrates dynamic areas outside of guardband limits. Graph 730 illustrates the baseline trace data (e.g., of block 702) and graph 732 illustrates the augmented trace data (e.g., of block 712).

Graph 734 illustrates area 736 (e.g., allowable area, green area), area 738 (e.g., warning area, yellow area), and area 740 (e.g., abnormal area). Graph 734 may be formed based on trace data from good substrates. All of the data points on Graph 734 may be either in area 736 or area 738.

Graph 742 illustrates new trace data for substrates where it is to be determined whether the substrates are good or bad. Graph 742 has trace data in area 736, area 738, and area 740. Data points in area 740 correspond to bad substrates. The area 738 (e.g., yellow area, alert area) is to be recalculated based on data points in area 738.

Figure 7C:
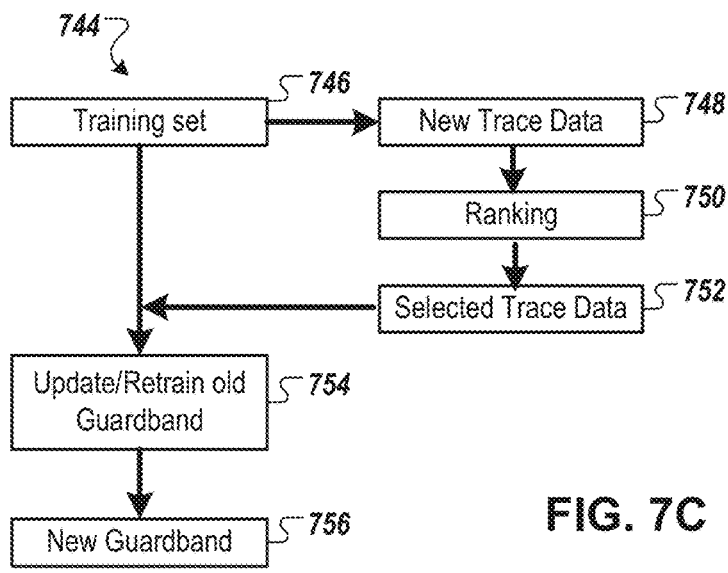

FIG. 7C illustrates a flow diagram of method 744 associated with dynamic areas outside of guardband limits.

At block 746, processing logic identifies a training set of trace data. The training set may be previous trace data used to produce substrates with the substrate processing equipment.

At block 748, processing logic identifies new trace data. In some embodiments, the new trace data includes new sensor data associated with producing new substrates with the same substrate processing equipment as block 746 or with different substrate processing equipment. In some embodiments, the new trace data includes simulated trace data that is made based on the trace date of block 746 and includes one or more of drift, noise, spikes, oscillation, etc.

At block 750, processing logic ranks the new trace data from block 748. The new trace data may be ranked based on being representative (e.g., proximity to) the trace data of block 746. The new trace data may be ranked based on proximity to each other (e.g., remove anomalies). The data points of the new trace data may ranked as good (e.g., green area), acceptable and used to adjust guardband (e.g., yellow area), or anomalous (e.g., red area). For example, data points of the new trace data may be within a green area (e.g., no input guardband adjustment), in an acceptable yellow area (e.g., no anomaly, but input for GB adjustment), or in an anomalous red area (e.g., anomaly, but no input to guardband adjustment).

At block 752, processing logic selects at least a portion of the new trace data from block 748 (e.g., based on the rankings from block 750). The processing logic may select the highest ranked trace data based on the ranking of block 750.

At block 754, processing logic updates (e.g., see FIG. 7E) or retrains (e.g., see FIG. 7F) an old guardband based on the training set and/or the trace data selected from block 752. The processing logic may trigger guardband updating when certain criteria are met (e.g., trace data has noise, trace data does not have drift, etc.).

At block 756, processing logic identifies a new guardband that has been updated or retrained from block 754.

Figure 7D:
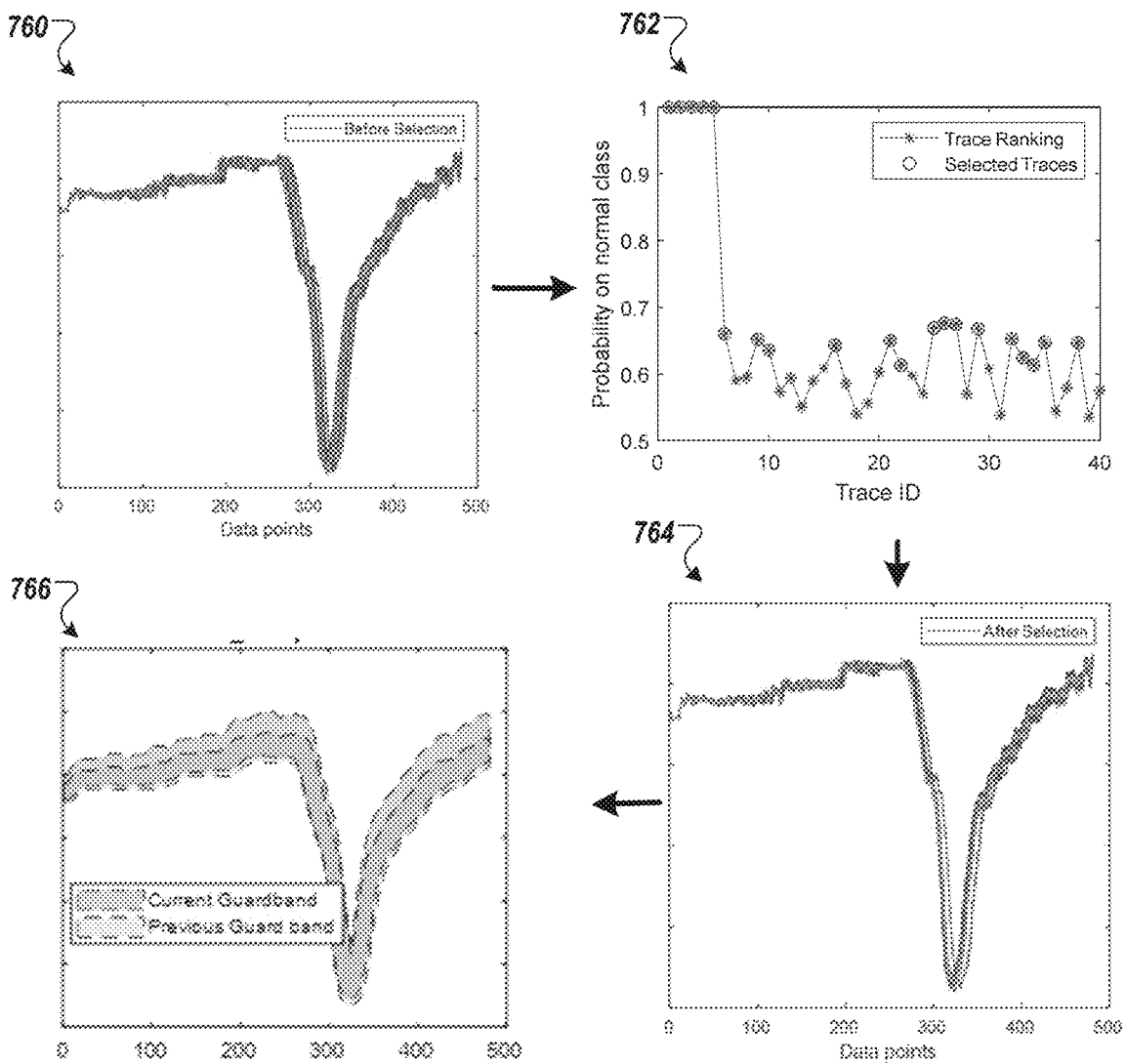

FIG. 7D illustrates dynamic areas outside of guardband limits. Graph 760 illustrates new trace data (e.g., from block 748 of FIG. 7C) and graph 762 illustrates trace ranking (e.g., see block 750 of FIG. 7C) of the trace data of graph 760.

Graph 764 illustrates selected traces (e.g., from block 752 of FIG. 7C) and graph 766 illustrates adapted guardband (e.g., new guardband of block 756 of FIG. 7C) that is updated from the selected traces (e.g., the most informative traces) from graph 764.

Figure 7E:
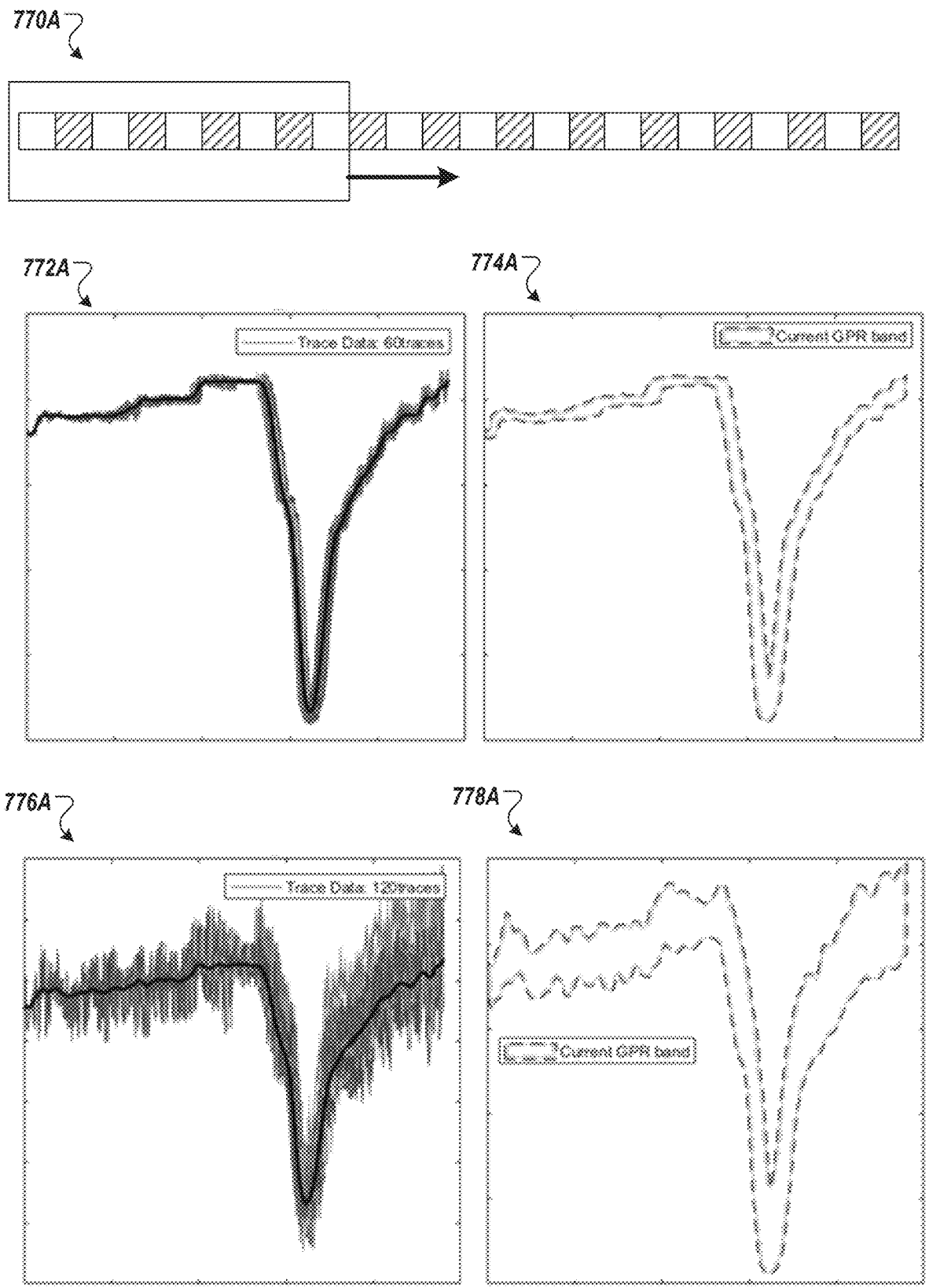

FIG. 7E illustrates dynamic areas outside of guardband limits for noise. Block diagram 770A illustrates that process data (e.g., trace data) to generate the guardband is accumulating. Responsive to the processing logic detecting noise (e.g., periodical changes), the processing logic updates the guardband with all historical data.

Graph 772A illustrates initial trace data (e.g., first 60 traces) and graph 774A illustrates an initial guardband for the trace data of graph 772A.

Graph 776A illustrates trace data (e.g., first 120 traces) and graph 778A illustrates a subsequent guardband for the trace data of graph 776A. As shown in graph 778A, the guardband widens over time to accommodate increase in acceptable noise.

Figure 7F:
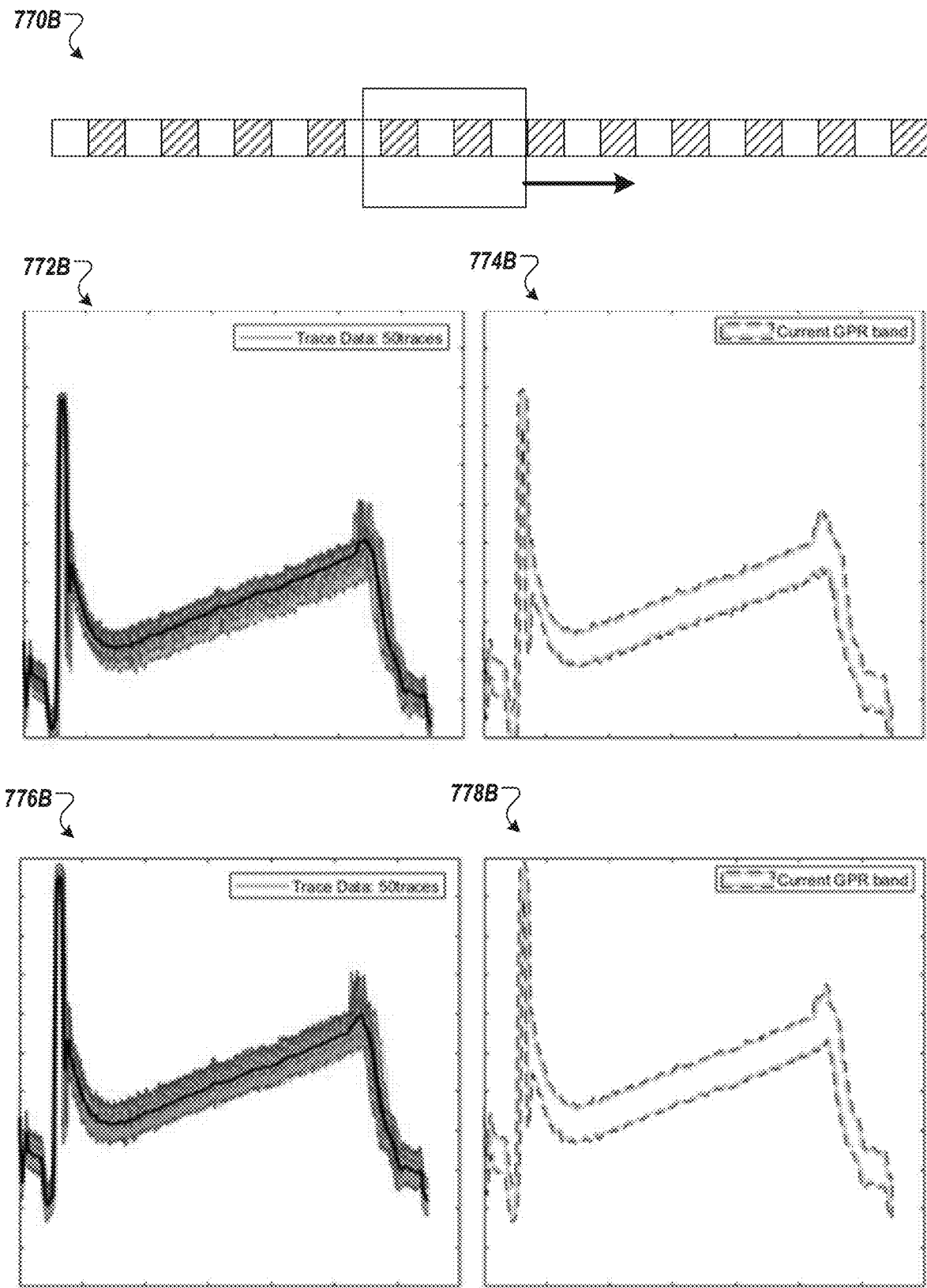

FIG. 7F illustrates dynamic areas outside of guardband limits for drift. Block diagram 770A illustrates that older historical data (e.g., previous trace data) is forgotten and only some amount (e.g., zero or more) of more recent historical data combined with new process data (e.g., current trace data) is used to generate the guardband. Responsive to the processing logic detecting drift (e.g., change in the y-direction of the sensor values over time), the processing logic triggers a forgetting mechanism and updates the guardband only with recent trace data.

Graph 772B illustrates initial trace data (e.g., first 50 traces) and graph 774B illustrates an initial guardband for the trace data of graph 772B.

Graph 776B illustrates trace data (e.g., subsequent 50 traces) and graph 778B illustrates a subsequent guardband for the trace data of graph 776B. As shown in graph 778B, the guardband moves (e.g., rises) in the y-direction over time to accommodate acceptable drift.

Figure 8A:
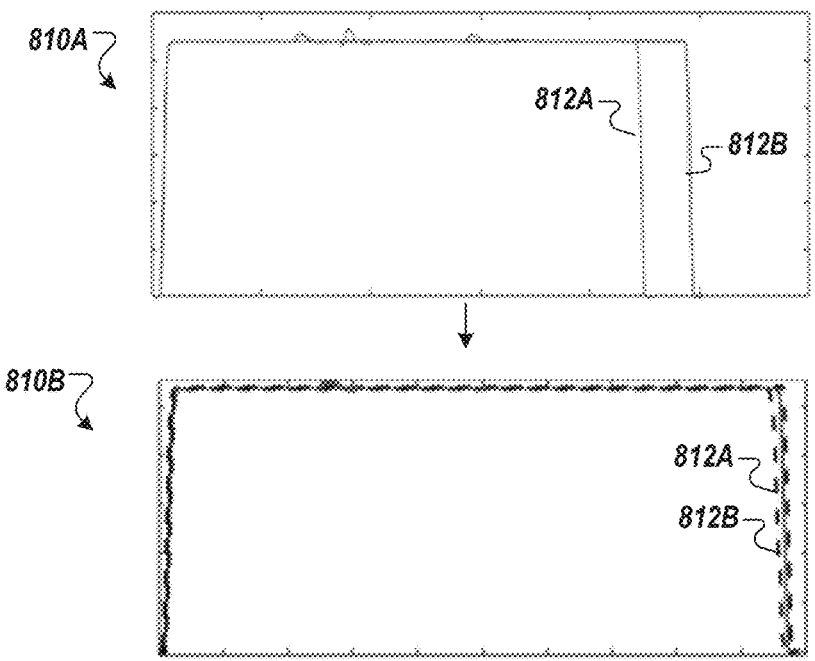
FIGS. 8A-B illustrate guardband adaptation, according to certain embodiments.
Figure 8B:
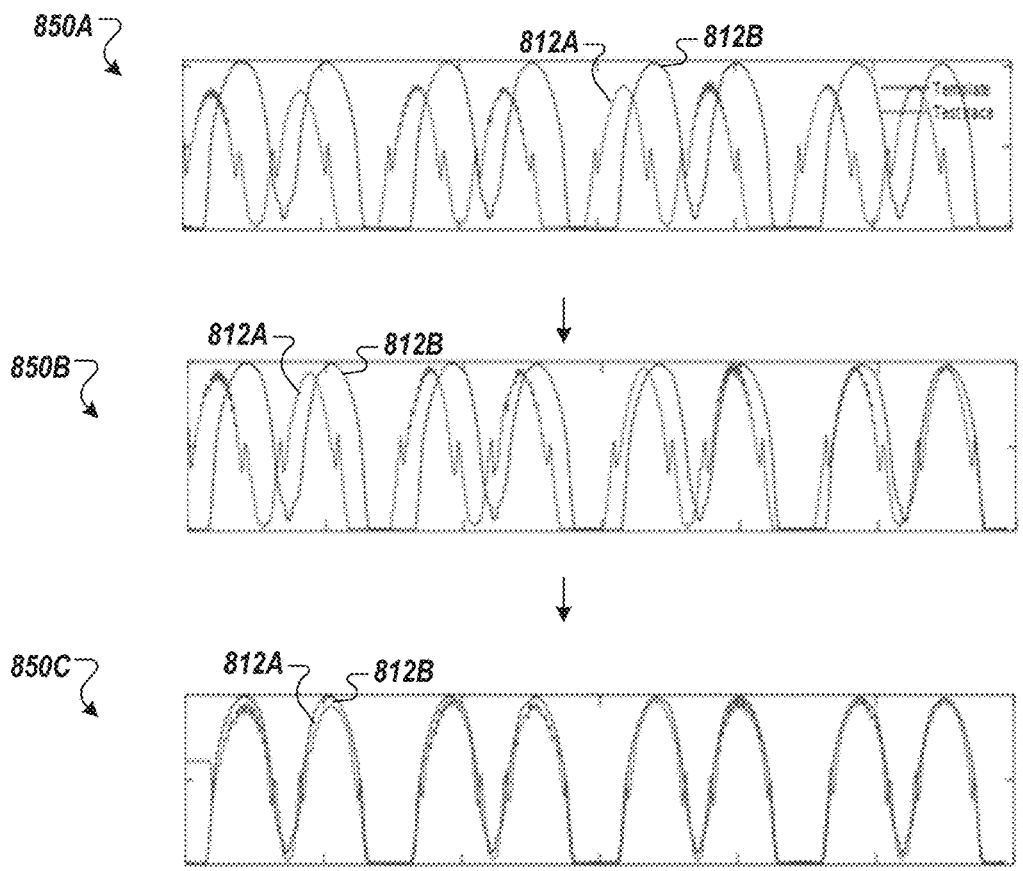

FIGS. 8A-B illustrate guardband adaptation, according to certain embodiments. Guardband adaptation shown in any portion of FIGS. 8A-B may be used for any of the methods of the present disclosure (e.g., FIGS. 2A-D, 3A-D, and/or 4A-D) to adapt the guardband to system dynamics (e.g., not adapt to violations, such as fault-level shifts).

FIG. 8A illustrates horizontal scaling. Graph 810A illustrates trace data 812A and trace data 812B. Trace data 812A and 812B may have different scales in the y-direction. As shown in Graph 810B, trace data 812A and/or trace data 812B may undergo horizontal scaling (e.g., recipe end-point horizontal scaling).

In some embodiments, trace data 812A and 812B are for good substrates. By horizontally scaling, a more accurate guardband may be created based on trace data 812A and 812B. By horizontally scaling trace data that may correspond to good or bad substrates, differences between the trace data and the guardband can be more accurately identified (e.g., decreasing false positives and missed positives).

FIG. 8B illustrates vertical scaling and horizontal warping. Graph 850A illustrates trace data 812A and trace data 812B that have different scales in the y-direction. Vertical scaling of trace data 812A and 812B of graph 850A may be performed to generate graph 850B (e.g., amplitude normalized). Horizontal warping of trace data 812A and 812B of graph 850B may be performed to generate graph 850C (e.g., dynamic time warping).

With trace warping and scaling, out-of-phase and differing amplitude factors may be ignored. Horizontal warping is applied to ignore out-of-phase factor and preserve vertical noise. Vertical and horizontal scaling is applied to address domain transfer (e.g., applying guardband to a different domain, such as a different recipe).

Figure 9:
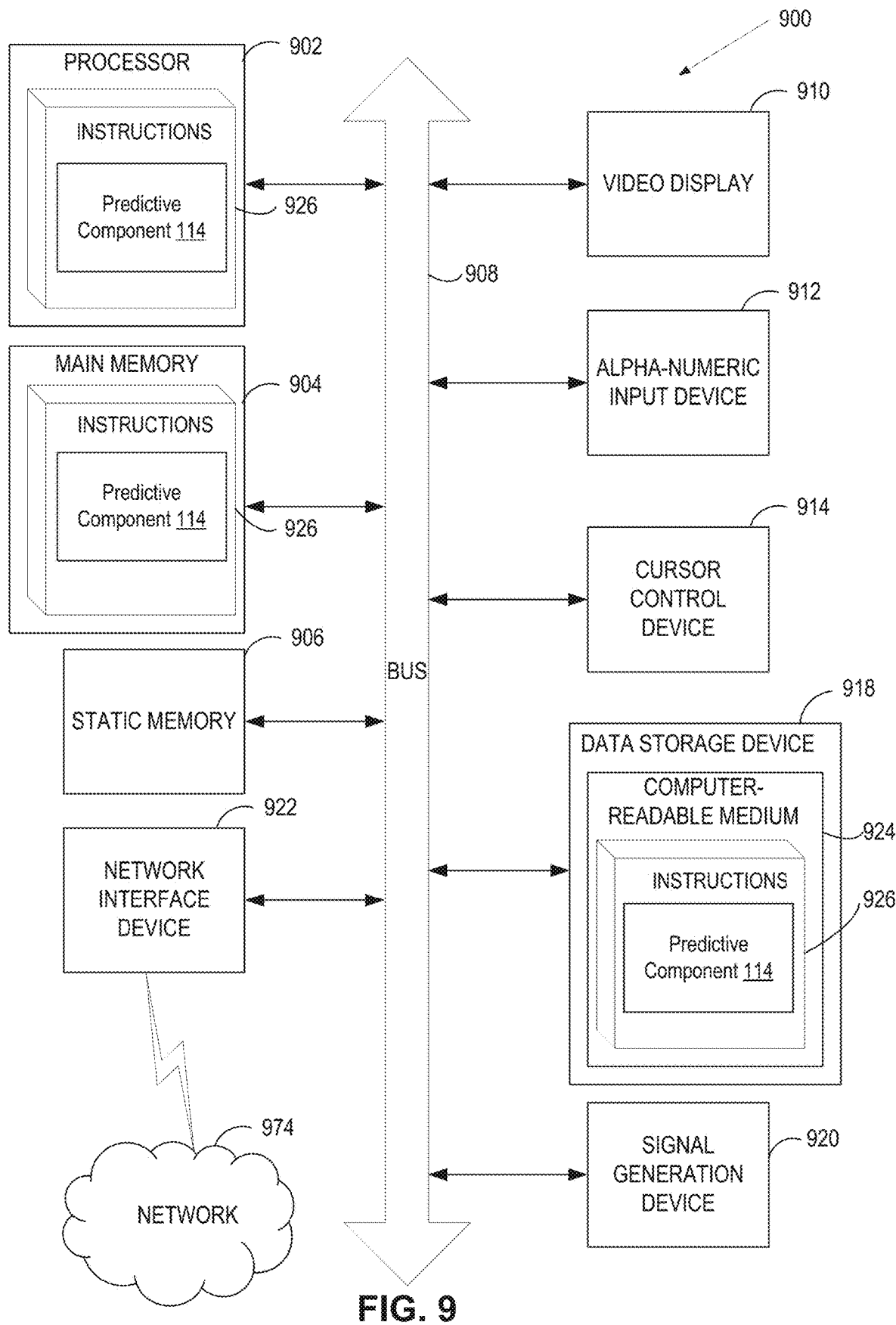
FIG. 9 is a block diagram illustrating a computer system, according to certain embodiments.

FIG. 9 is a block diagram illustrating a computer system 900, according to certain embodiments. In some embodiments, computer system 900 may be connected (e.g., via a network, such as a Local Area Network (LAN), an intranet, an extranet, or the Internet) to other computer systems. Computer system 900 may operate in the capacity of a server or a client computer in a client-server environment, or as a peer computer in a peer-to-peer or distributed network environment. Computer system 900 may be provided by a personal computer (PC), a tablet PC, a Set-Top Box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 900 may include a processing device 902, a volatile memory 904 (e.g., Random Access Memory (RAM)), a non-volatile memory 906 (e.g., Read-Only Memory (ROM) or Electrically-Erasable Programmable ROM (EEPROM)), and a data storage device 918, which may communicate with each other via a bus 908.

Processing device 902 may be provided by one or more processors such as a general purpose processor (such as, for example, a Complex Instruction Set Computing (CISC) microprocessor, a Reduced Instruction Set Computing (RISC) microprocessor, a Very Long Instruction Word (VLIW) microprocessor, a microprocessor implementing other types of instruction sets, or a microprocessor implementing a combination of types of instruction sets) or a specialized processor (such as, for example, an Application Specific Integrated Circuit (ASIC), a Field Programmable Gate Array (FPGA), a Digital Signal Processor (DSP), or a network processor).

Computer system 900 may further include a network interface device 922 (e.g., coupled to network 974). Computer system 900 also may include a video display unit 910 (e.g., an LCD), an alphanumeric input device 912 (e.g., a keyboard), a cursor control device 914 (e.g., a mouse), and a signal generation device 920.

In some embodiments, data storage device 918 may include a non-transitory computer-readable storage medium 924 (e.g., non-transitory machine-readable storage medium) on which may store instructions 926 encoding any one or more of the methods or functions described herein, including instructions encoding components of FIG. 1 (e.g., predictive component 114 used to predict or detect, model 190, etc.) and for implementing methods described herein. The instructions may, when executed, cause a processing device to perform the methods described herein.

Instructions 926 may also reside, completely or partially, within volatile memory 904 and/or within processing device 902 during execution thereof by computer system 900, hence, volatile memory 904 and processing device 902 may also constitute machine-readable storage media.

While computer-readable storage medium 924 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

The methods, components, and features described herein may be implemented by discrete hardware components or may be integrated in the functionality of other hardware components such as ASICS, FPGAs, DSPs or similar devices. In addition, the methods, components, and features may be implemented by firmware modules or functional circuitry within hardware devices. Further, the methods, components, and features may be implemented in any combination of hardware devices and computer program components, or in computer programs.

Unless specifically stated otherwise, terms such as "identifying," "generating," "causing," "providing," "receiving," "determining," "updating," "comparing," "training," "warping," "scaling," "obtaining," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and may not have an ordinal meaning according to their numerical designation.

Examples described herein also relate to an apparatus for performing the methods described herein. This apparatus may be specially constructed for performing the methods described herein, or it may include a general purpose computer system selectively programmed by a computer program stored in the computer system. Such a computer program may be stored in a computer-readable tangible storage medium.

The methods and illustrative examples described herein are not inherently related to any particular computer or other apparatus. Various general purpose systems may be used in accordance with the teachings described herein, or it may prove convenient to construct more specialized apparatus to perform methods described herein and/or each of their individual functions, routines, subroutines, or operations. Examples of the structure for a variety of these systems are set forth in the description above.

The above description is intended to be illustrative, and not restrictive. Although the present disclosure has been described with references to specific illustrative examples and embodiments, it will be recognized that the present disclosure is not limited to the examples and embodiments described. The scope of the disclosure should be determined with reference to the following claims, along with the full scope of equivalents to which the claims are entitled.

What is claimed is:

1. A method comprising:
    identifying trace data comprising a plurality of data points, the trace data being associated with production, via a substrate processing system, of substrates having property values that meet threshold values;
    generating, based on the trace data and a plurality of allowable types of variance, a guardband comprising an upper limit and a lower limit for fault detection; and
    causing, based on the guardband, performance of a corrective action associated with the substrate processing system.

2. The method of claim 1, wherein the trace data comprises sensor data from a plurality of runs of substrate processing operations, wherein the plurality of allowable types of variance comprises trace-to-trace variability of time shifts.

3. The method of claim 1, wherein the generating of the guardband comprises determining a first allowable type of variance to form the upper limit and determining a second allowable type of variance to form the lower limit, the first allowable type of variance being different from the second allowable type of variance.

4. The method of claim 1, wherein the trace data comprises sensor data from different types of sensors, wherein the generating of the guardband is via multi-variable analysis.

5. The method of claim 1, wherein the generating of the guardband comprises training a machine learning model with data input comprising the trace data to generate a trained machine learning model comprising the guardband.

6. The method of claim 1 further comprising:
    identifying additional trace data;
    providing the additional trace data as data input into a trained machine learning model trained with the trace data, the guardband being generated via the trained machine learning model; and
    receiving, from the trained machine learning model, output indicative of predictive data, wherein the performance of the corrective action is based on the predictive data.

7. The method of claim 1, wherein the generating of the guardband comprises:
    generating an initial guardband based on the trace data;
    determining, based on the trace data and the initial guardband, the plurality of allowable types of variance; and
    updating, based on the plurality of allowable types of variance, the initial guardband to form the guardband.

8. The method of claim 1, wherein the generating of the guardband is further based on:
    segmentation of portions of the trace data associated with change in values that exceeds a threshold change; and
    extraction of features from the trace data.

9. A method comprising:
    identifying trace data comprising a plurality of data points, the trace data being associated with production, via a substrate processing system, of substrates;

comparing the trace data to a guardband generated based on historical trace data and a plurality of allowable types of variance associated with the historical trace data, the historical trace data being associated with historical production, via the substrate processing system, of historical substrates having historical property values that meet threshold values, the guardband comprising an upper limit and a lower limit for fault detection; and responsive to one or more data points of the trace data not being within the guardband, causing performance of a corrective action associated with the substrate processing system.

10. The method of claim 9, wherein the historical trace data comprises historical sensor data from a plurality of runs of substrate processing operations, wherein the plurality of allowable types of variance comprises trace-to-trace variability of time shifts.

11. The method of claim 9, the guardband comprises a first allowable type of variance that forms the upper limit and a second allowable type of variance that forms the lower limit, the first allowable type of variance being different from the second allowable type of variance.

12. The method of claim 9, wherein the trace data comprises sensor data from different types of sensors, the guardband being generated via multi-variable analysis.

13. The method of claim 9, the guardband being generated by training a machine learning model with data input comprising the historical trace data to generate a trained machine learning model comprising the guardband, wherein the comparing of the trace data to the guardband comprises:
  providing the trace data as data input into the trained machine learning model; and
  receiving, from the trained machine learning model, output indicative of predictive data, wherein the causing of the performance of the corrective action is based on the predictive data.

14. The method of claim 9, the guardband being generated by: segmentation of portions of the historical trace data associated with change in values that exceed a threshold change; and extraction of features from the historical trace data.

15. A non-transitory computer-readable storage medium storing instructions which, when executed, cause a processing device to perform operations comprising:
  identifying trace data comprising a plurality of data points, the trace data being associated with production, via a substrate processing system, of substrates having property values that meet threshold values;
  generating, based on the trace data and a plurality of allowable types of variance, a guardband comprising an upper limit and a lower limit for fault detection; and
  causing, based on the guardband, performance of a corrective action associated with the substrate processing system.

16. The non-transitory computer-readable storage medium of claim 15, wherein the trace data comprises sensor data from a plurality of runs of substrate processing operations, wherein the plurality of allowable types of variance comprises trace-to-trace variability of time shifts.

17. The non-transitory computer-readable storage medium of claim 15, wherein the generating of the guardband comprises determining a first allowable type of variance to form the upper limit and determining a second allowable type of variance to form the lower limit, the first allowable type of variance being different from the second allowable type of variance.

18. The non-transitory computer-readable storage medium of claim 15, wherein the trace data comprises sensor data from different types of sensors, wherein the generating of the guardband is via multi-variable analysis.

19. The non-transitory computer-readable storage medium of claim 15, wherein the generating of the guardband comprises training a machine learning model with data input comprising the trace data to generate a trained machine learning model comprising the guardband.

20. The non-transitory computer-readable storage medium of claim 15 further comprising:
  identifying additional trace data;
  providing the additional trace data as data input into a trained machine learning model trained with the trace data, the guardband being generated via the trained machine learning model; and
  receiving, from the trained machine learning model, output indicative of predictive data, wherein the performance of the corrective action is based on the predictive data.

* * * * *